United States Patent
Kim et al.

(10) Patent No.: US 10,727,958 B2
(45) Date of Patent: Jul. 28, 2020

(54) METHOD AND DEVICE FOR MEASURING ANTENNA REFLECTION COEFFICIENT

(71) Applicant: Samsung Electronics Co., Ltd., Suwon-si, Gyeonggi-do (KR)

(72) Inventors: Daeyoung Kim, Suwon-si (KR); Youngik Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/561,579

(22) Filed: Sep. 5, 2019

(65) Prior Publication Data

US 2020/0169331 A1 May 28, 2020

(30) Foreign Application Priority Data

Nov. 27, 2018 (KR) .................. 10-2018-0148763
Apr. 4, 2019 (KR) .................. 10-2019-0039744

(51) Int. Cl.
*H04B 7/04* (2017.01)
*H04B 17/10* (2015.01)
*G01R 29/10* (2006.01)

(52) U.S. Cl.
CPC ........... *H04B 17/103* (2015.01); *G01R 29/10* (2013.01)

(58) Field of Classification Search
CPC . H04B 1/04; H04B 7/04; H04B 17/00; H04B 17/103; H04B 17/104; H04W 8/24; G01R 29/10
See application file for complete search history.

(56) References Cited

U.S. PATENT DOCUMENTS

| | | | |
|---|---|---|---|
| 8,185,055 B2 | 5/2012 | Choi et al. | |
| 8,233,851 B2 | 7/2012 | Jeon et al. | |
| 8,643,553 B2 | 2/2014 | Teshirogi et al. | |
| 9,140,733 B2 | 9/2015 | Schmidhammer et al. | |
| 9,357,338 B2 | 5/2016 | Iida | |
| 9,594,147 B2 | 3/2017 | Han et al. | |
| 9,698,758 B2 | 7/2017 | Spears et al. | |
| 2004/0264431 A1* | 12/2004 | Rhodes | H04L 27/2607 370/343 |
| 2013/0301487 A1* | 11/2013 | Khandani | H04B 7/026 370/278 |
| 2014/0327594 A1 | 11/2014 | Zhang et al. | |

(Continued)

FOREIGN PATENT DOCUMENTS

KR  10-2008-0035888 A  4/2008
KR  10-2010-0089588 A  8/2010

*Primary Examiner* — Thanh C Le

(74) *Attorney, Agent, or Firm* — Harness, Dickey & Pierce, P.L.C.

(57) ABSTRACT

A device for measuring a reflection coefficient of an antenna includes processing circuitry configured to extract a first feedback signal and a second feedback signal from a third feedback signal based on first symbol information of a first symbol included in a radio frequency (RF) transmit signal transferred to the antenna, the first feedback signal corresponding to at least a portion of a cyclic prefix portion of the first symbol, the second feedback signal corresponding to at least a portion of a back-end portion of the first symbol, the third feedback signal being generated from a portion of the RF transmit signal provided by a coupler, and compute the reflection coefficient based on the first feedback signal and the second feedback signal.

20 Claims, 12 Drawing Sheets

(56) References Cited

U.S. PATENT DOCUMENTS

2016/0294490 A1     10/2016  Zhou et al.
2017/0142615 A1*    5/2017   Bhalerao .............. H04B 17/104
2018/0026369 A1     1/2018   Kim et al.
2019/0044555 A1*    2/2019   Hewavithana ....... H04B 1/0475

* cited by examiner

METHOD AND DEVICE FOR MEASURING ANTENNA REFLECTION COEFFICIENT

CROSS-REFERENCE TO RELATED APPLICATIONS

This application claims the benefit of Korean Patent Application Nos. 10-2018-0148763 and 10-2019-0039744, respectively filed on Nov. 27, 2018 and Apr. 4, 2019, in the Korean Intellectual Property Office, the disclosures of which are incorporated herein in their entirety by reference.

BACKGROUND

The inventive concepts relate to wireless communication, and more particularly, to a method and device for measuring a reflection coefficient of an antenna used for wireless communication.

When an antenna used for wireless communication does not have a designed or desired impedance, the quality of the wireless communication may be degraded. A wireless communication device may include an antenna tuner, and the antenna tuner may be controlled to modify the impedance of the antenna based on a measured reflection coefficient (e.g., a measured impedance) of the antenna. Thus, an accurate measurement of the reflection coefficient of the antenna, while reducing overhead for measuring the reflection coefficient of the antenna would be desirable (e.g., due to miniaturization, low power, etc. of the wireless communication device).

SUMMARY

The inventive concepts provide a method and device for accurately measuring a reflection coefficient of an antenna while reducing overhead.

According to an aspect of the inventive concepts, there is provided a device for measuring a reflection coefficient of an antenna, the device including processing circuitry configured to extract a first feedback signal and a second feedback signal from a third feedback signal based on first symbol information of a first symbol included in a radio frequency (RF) transmit signal transferred to the antenna, the first feedback signal corresponding to at least a portion of a cyclic prefix portion of the first symbol, the second feedback signal corresponding to at least a portion of a back-end portion of the first symbol, the third feedback signal being generated from a portion of the RF transmit signal provided by a coupler, and compute the reflection coefficient based on the first feedback signal and the second feedback signal.

According to another aspect of the inventive concepts, there is provided a method of measuring a reflection coefficient of an antenna, the method including obtaining first symbol information of a first symbol included in a radio frequency (RF) transmit signal provided to the antenna via a coupler, obtaining a first feedback signal based on the first symbol information, the first feedback signal being generated from an RF feedback signal provided in a first interval in which the coupler transfers at least a portion of a cyclic prefix portion of the first symbol, obtaining a second feedback signal based on the first symbol information, the second feedback signal generated from the RF feedback signal provided in a second interval in which the coupler transfers at least a portion of a back-end portion of the first symbol, and computing the reflection coefficient based on the first feedback signal and the second feedback signal.

According to another aspect of the inventive concepts, there is provided a method of measuring a reflection coefficient of an antenna, the method including obtaining first symbol information of a first symbol included in a radio frequency (RF) transmit signal provided to the antenna via a coupler; setting the coupler in a first coupling direction before a first interval based on the first symbol information, the coupler transferring at least a portion of a cyclic prefix portion of the first symbol during the first interval; setting the coupler in a second coupling direction before a second interval based on the first symbol information, the coupler transferring at least a portion of a back-end portion of the first symbol during the second interval; and computing the reflection coefficient based on an RF feedback signal provided by the coupler during the first interval and the second interval.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
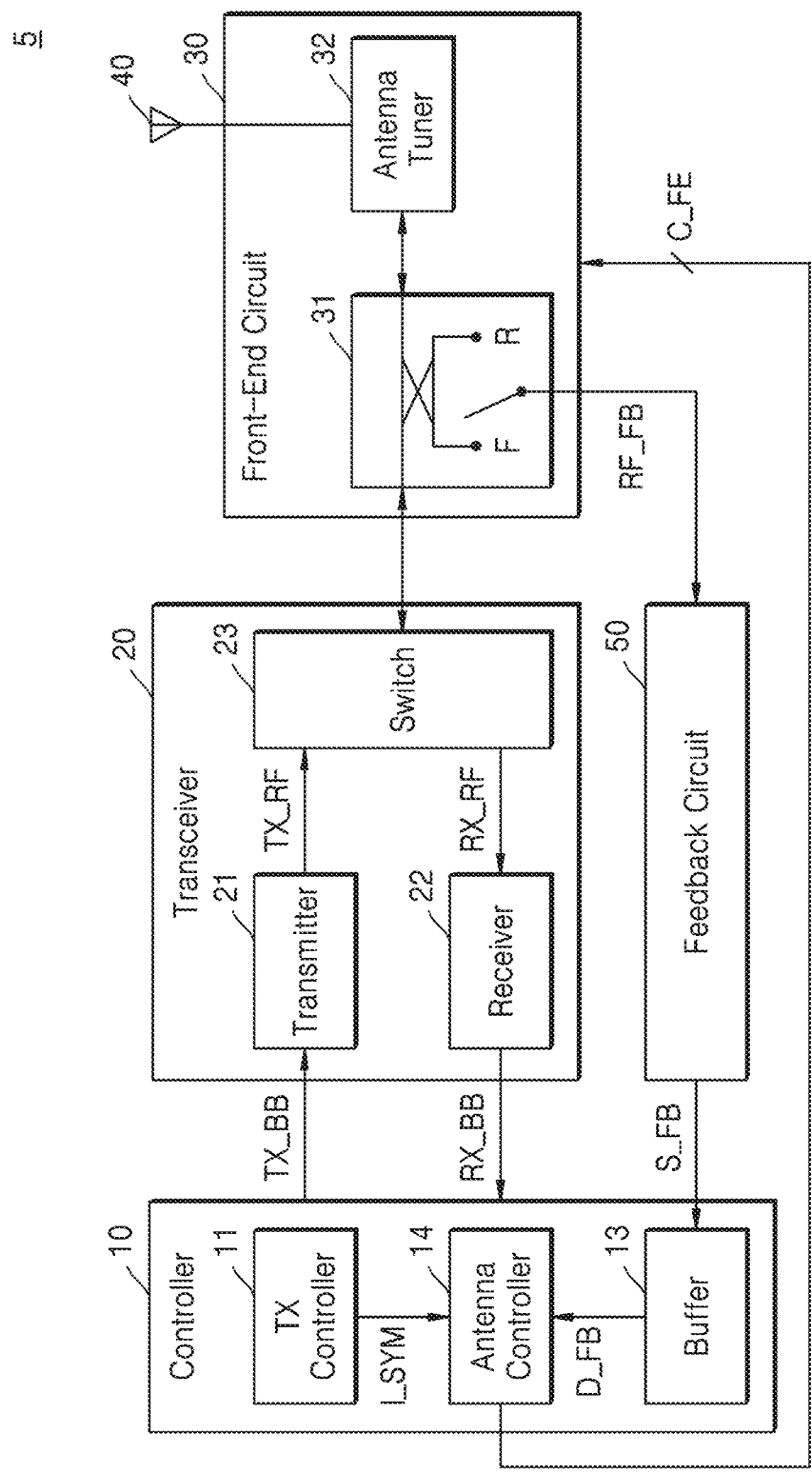
FIG. 1 is a block diagram of a wireless communication device including a coupler configured to output a forward feedback signal or a reverse feedback signal, according to an example embodiment of the inventive concepts.

FIG. 1 is a block diagram of a wireless communication device 5, according to an example embodiment of the inventive concepts. As illustrated in FIG. 1, the wireless communication device 5 may include a controller 10, a transceiver 20, a front-end circuit 30, an antenna 40, and/or a feedback circuit 50.

The wireless communication device 5 may be connected to a wireless communication system by transceiving (e.g., transmitting and/or receiving) signals via the antenna 40. The wireless communication system to which the wireless communication device 5 is capable of being connected may be referred to as system using radio access technology (RAT), and as a non-limiting example, may include a wireless communication system using a wireless communication network. The wireless communication network may be a cellular network such as a $5^{th}$ generation (e.g., 5G) wireless system, a long term evolution (LTE) system, an LTE-advanced system, a code division multiple access (CDMA) system, and/or a global system for mobile communications (GSM) system, and/or a wireless local area network (WLAN) system, and/or other wireless communication systems. Hereinafter, it may be assumed that the wireless communication system to which the wireless communication device 5 is connected may be a wireless communication system using a cellular network, but embodiments of the inventive concepts are not limited thereto.

The wireless communication network of the wireless communication system may support communication of a plurality of wireless communication devices including the wireless communication device 5 by sharing available network resources. For example, in the wireless communication network, information may be transmitted through various multiple connection methods such as CDMA, frequency division multiple access (FDMA), time division multiple access (TDMA), orthogonal frequency division multiple access (OFDMA), single carrier frequency division multiple access (SC-FDMA), OFDM-FDMA, OFDM-TDMA, and/or OFDM-CDMA.

According to some example embodiments, the wireless communication device 5 may be a base station connected to the wireless communication system. The base station (BS may be generally referred to as a fixed station communicating with user equipment and/or another BS (e.g., via the wireless communication network), and may exchange data and/or control information by communicating with the user equipment and/or the other BS. For example, the BS may be referred to as a Node B, an evolved-Node B (eNB), a next generation Node B (gNB), a sector, a site, a base transceiver system (BTS), an access point (AP), a relay node, a remote radio head (RRH), a radio unit (RU), a small cell, etc. In the present specification, the BS may be interpreted in a comprehensive sense to denote some function covered by a BS controller (BSC) in CDMA, the Node B in WCDMA, the eNB or a sector (site) in LTE, etc., and may include various coverage areas (e.g., a cell) such as a megacell, a macrocell, a microcell, a picocell, a femtocell, a relay node, the RRH, the RU, and/or a small cell communication range.

According to some example embodiments, the wireless communication device 5 may be user equipment (UE). The UE may be fixed or mobile, and may be capable of transceiving (e.g., transmitting and/or receiving) data and/or control information by communication with the BS. For example, the UE may be referred to as terminal equipment, a mobile station (MS), a user terminal (UT), a subscriber station (SS), a wireless device, a handheld device, a mobile device, a smart phone, a cellular telephone, etc. In the present specification, the wireless communication device 5 may be assumed to be the UE, but embodiments are not limited thereto.

Referring to FIG. 1, the antenna 40 may be connected to the front-end circuit 30 and may transmit signals provided by the front-end circuit 30 to other wireless communication devices, and/or may provide signals received from other wireless communication devices to the front-end circuit 30. In some embodiments, the wireless communication device 5 may include a plurality of antennas 40 for use in phased array, multiple-input and multiple-output (MIMO), etc. The antenna 40 may have an impedance, and the impedance of the antenna 40 may be changed due to various causes. To compensate for an impedance change of the antenna 40, as described below, the antenna 40 may be connected to an antenna tuner 32 included in the front-end circuit 30.

The front-end circuit 30 may include a coupler 31 and/or the antenna tuner 32. The coupler 31 may be connected to the transceiver 20 and the antenna tuner 32. The coupler 31 may receive a radio frequency (RF) transmit signal TX_RF, and may provide to the feedback circuit 50 a signal coupled with the RF transmit signal TX_RF in a convertible coupling direction (or, referred to as a forward coupling signal), and/or a signal reflected from the antenna 40 and the antenna tuner 32 (or, referred to as a reverse coupling signal), as an RF feedback signal RF_FB. For example, as illustrated in FIG. 1, the coupler 31 may be referred to as a bi-directional coupler, and when a forward coupling F is set, may provide to the feedback circuit 50 the signal coupled with the RF transmit signal TX_RF as the RF feedback signal RF_FB, and when a reverse coupling R is set, may provide to the feedback circuit 50 the reflected signal as the RF feedback signal RF_FB. The coupling direction of the coupler 31 may be set according to a front-end control signal C_FE based on the front-end control signal C_FE provided by an antenna controller 14. In some embodiments, as described below with reference to FIGS. 4 and 5, the coupler 31 may simultaneously or contemporaneously provide to the feedback circuit 50 both the signal coupled with the RF transmit signal TX_RF and the reflected signal. The antenna tuner 32 may have a variable impedance according to the front-end signal C_FE, and accordingly, impedance of the antenna 40 and/or antenna tuner 32 may be controlled. According to some example embodiments, the impedance of the antenna 40 and antenna tuner 32 (e.g., the combined impedance of the antenna 40 and the antenna tuner 32) may be referred simply as an impedance or a reflection coefficient of the antenna 40.

The transceiver 20 may include a transmitter 21, a receiver 22, and/or a switch 23. The transmitter 21 may generate the RF transmit signal TX_RF by processing a baseband transmit signal TX_BB received from the controller 10. For example, the transmitter 21 may include a filter, a mixer, a power amplifier, etc. In the present specification, the RF transmit signal TX_RF provided to the coupler 31 in a transmit mode may be referred simply as a transmit signal. The receiver 22 may generate a baseband receive signal RX_BB by processing an RF receive signal RX_RF received from the switch 23. For example, the receiver 22 may include a filter, a mixer, a low noise amplifier, etc. In the present specification, the RF receive signal RX_RF provided to the receiver 22 by the coupler 31 in a receive mode, and the baseband receive signal RX_BB, may be referred simply as a receive signal. The switch 23 may provide to the receiver 22 a signal received via the coupler 31 in the receive mode as the RF receive signal RX_RF, while providing to the front-end circuit 30 the RF transmit signal TX_RF in the transmit mode. In some embodiments, the switch 23 may be replaced by a duplexer and/or a switchplexer, or in some embodiments, the switch 23 may include a duplexer and/or a switchplexer.

The feedback circuit 50 may receive the RF feedback signal RF_FB from the coupler 31 and may generate a feedback signal S_FB (or, a baseband feedback signal) by processing the RF feedback signal RF_FB. For example, the feedback circuit 50 may include a filter, a mixer, etc. As illustrated in FIG. 1, the feedback circuit 50 may provide the feedback signal S_FB to the controller 10.

The controller 10 may include a transmit (TX) controller 11, a buffer 13, and/or the antenna controller 14, and as described below, the buffer 13 and the antenna controller 14 may be used for measuring the reflection coefficient of the antenna 40. According to some example embodiments, operations described herein as being performed by the wireless communication device 5, the controller 10, the transceiver 20, the front-end circuit 30, the feedback circuit 50, the antenna tuner 32, the transmitter 21, the receiver 22, the TX controller 11 and/or the antenna controller 14 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, components included in the controller 10 may be implemented in a dedicated hardware block designed by logic synthesis, etc., may be implemented in a processing unit including at least one processor and a software block that is processed by the at least one processor, and may be implemented in a combination of the dedicated hardware block and the processing unit. In the present specification, the controller 10 may be referred to as a device for measuring the reflection coefficient of the antenna 40.

The TX controller 11 may control transmission via the transmitter 21. For example, the TX controller 11 may set various transmission parameters and control the transmitter 21 included in the transceiver 20, such that the baseband transmit signal TX_BB and the RF transmit signal TX_RF are generated, according to a wireless communication system to which the wireless communication device 5 is connected and/or a counterpart wireless communication device. As illustrated in FIG. 1, the TX controller 11 may provide to the antenna controller 14 symbol information I_SYM included in the RF transmit signal TX_RF among the transmission parameters. For example, the symbol information I_SYM may include a length of a symbol and/or a length of a cyclic prefix portion, and/or as described below with reference to FIGS. 13 and 14, may include information about a windowing interval, and as described below, may be used to measure the reflection coefficient of the antenna 40.

The buffer 13 may capture (e.g., store) the feedback signal S_FB provided by the feedback circuit 50, and provide feedback data D_FB to the antenna controller 14. For example, the buffer 13 may include a memory, cache, etc. and may store the feedback data D_FB generated by capturing the feedback signal S_FB in the memory. In some embodiments, the buffer 13 may capture the feedback signal S_FB according to a control (e.g., a control signal) of the antenna controller 14 in a certain interval (e.g., periodically according to the certain interval).

The antenna controller 14 may receive the symbol information I_SYM from the TX controller 11 and receive the feedback data D_FB from the buffer 13. In addition, the antenna controller 14 may obtain timing information indicating a limit of the symbol in various manners. The antenna controller 14 may generate the front-end signal C_FE, and the front-end signal C_FE may include a coupler control signal for setting a coupling direction of the coupler 31 and/or an antenna tuning signal for adjusting impedance of the antenna tuner 32.

The antenna controller 14 may measure the reflection coefficient (or impedance) of the antenna 40 by using a characteristic that symbols included in the RF transmit signal TX_RF include cyclic prefix portions and back-end portions matching the cyclic prefix portions. For example, as described below with reference to FIG. 2, the antenna controller 14 may obtain the cyclic prefix portion, from one symbol based on the symbol information I_SYM provided by the TX controller 11 and the timing information of the symbol, in a state where the coupler 31 is set in a first coupling direction, and may obtain the back-end portion of the symbol in a state where the coupler 31 is set in a second coupling direction. The antenna controller 14 may compute the reflection coefficient of the antenna 40 from the cyclic prefix portion and the back-end portion of the symbol that correspond to different coupling directions of the coupler 31. Accordingly, to measure the reflection coefficient of the antenna 40, additional components for a feedback of a transmit signal provided to the antenna 40, for example, the RF transmit signal TX_RF, may be omitted. In addition, since the timing of the reflected signal may be determined without consideration of a delay generated in a feedback path including the coupler 31 and the feedback circuit 50, the reflection coefficient of the antenna 40 may be accurately measured.

Figure 2:
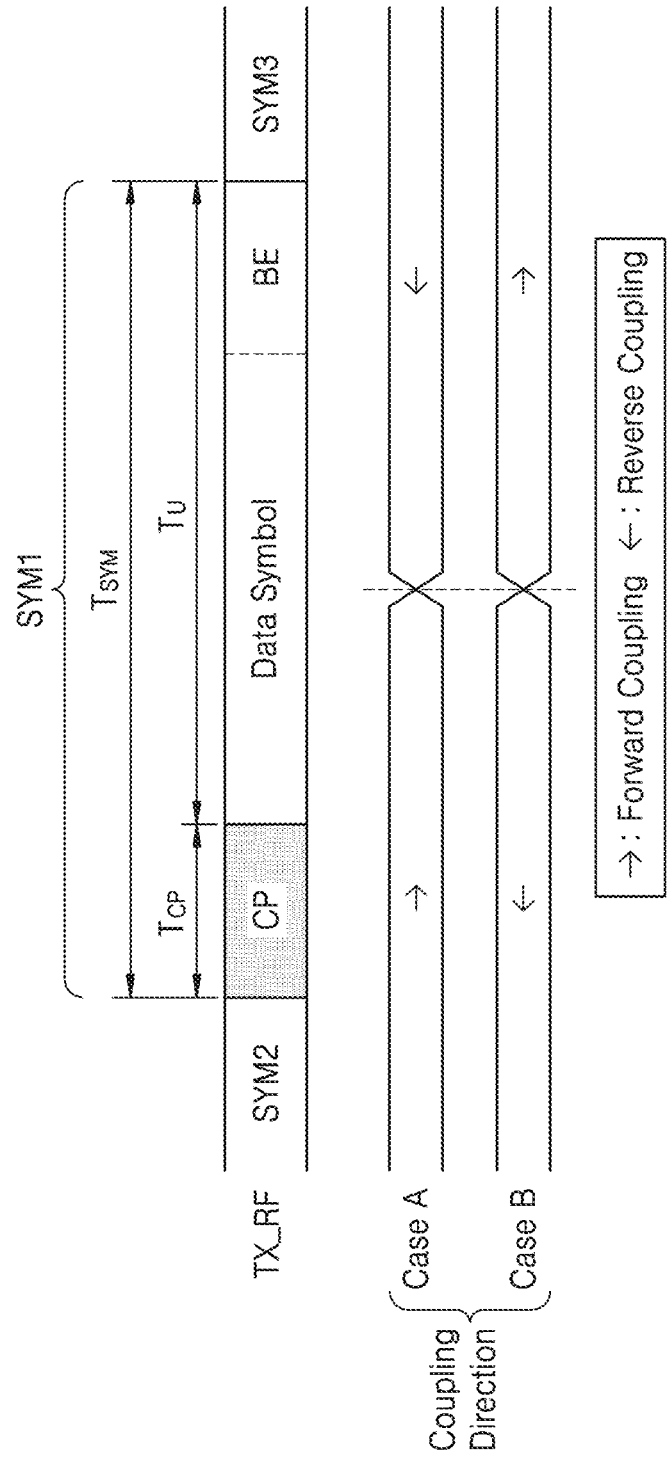
FIG. 2 is a timing diagram of an example of an operation of measuring a reflection coefficient of an antenna, according to an example embodiment of the inventive concepts.

FIG. 2 is a timing diagram of an example of an operation of measuring the reflection coefficient of the antenna 40, according to an example embodiment of the inventive concepts. Hereinafter, FIG. 2 is described with reference to FIG. 1.

The RF transmit signal TX_RF provided to the antenna 40 in FIG. 1 may include a series of symbols. For example, as illustrated in FIG. 2, the RF transmit signal TX_RF may include a first symbol SYM1, a second symbol SYM2 preceding the first symbol SYM1, and a third symbol SYM3 following the first symbol SYM1. The first symbol SYM1 may include the cyclic prefix portion CP and a data symbol, and a length $T_{SYM}$ of the first symbol SYM1 may be the same as or similar to a sum of a length $T_{CP}$ of the cyclic prefix portion CP and a length $T_U$ of the data symbol. The length $T_{CP}$ of the cyclic prefix portion CP may be referred to as a guard interval, and the data symbol may be referred to as an effective portion of the first symbol SYM1. The cyclic prefix portion CP may be a copy of the back-end portion BE of the data symbol, may be inserted into a front-end of the data symbol, and due to the cyclic prefix portion CP, an inter-symbol interference (ISI) may be prevented or reduced and an inter-carrier interference (ICI) may be removed or reduced. In the present specification, the back-end portion BE of the data symbol that corresponds to the cyclic prefix portion CP may be simply referred to as the back-end portion BE.

As described above with reference to FIG. 1, the antenna controller 14 may control the coupler 31 such that the coupler 31 has different coupling directions in an interval (e.g., a first interval) through which the cyclic prefix portion CP is passed and in an interval (e.g., a second interval) through which the back-end portion BE is passed. For example, in 'Case A' in FIG. 2, the coupler 31 may be set as the forward coupling F in the interval including the cyclic prefix portion CP, while being set as the reverse coupling R in the interval including the back-end portion BE. In addition, in 'Case B' in FIG. 2, the coupler 31 may be set as the reverse coupling R in the interval including the cyclic prefix portion CP, while being set as the forward coupling F in the interval including the back-end portion BE. Since the cyclic prefix portion CP is the copy of the back-end portion BE, a signal relating to the forward coupling F and a signal relating to the reverse coupling R may be obtained with respect to the same signal or a similar signal, and thus, the reflection coefficient of the antenna 40 may be computed. For example, when a signal $r_{fwd}$ indicates a signal obtained through the forward coupling F and a signal $r_{rev}$ indicates a signal obtained through the reverse coupling R, the reflection coefficient Γ of the antenna 40 may be computed as Formula 1 below.

$$\Gamma = \frac{|r_{rev}|}{|r_{fwd}|} \cdot \exp(j(\angle r_{rev} - \angle r_{fwd})) \quad \text{Formula 1}$$

Figure 3:
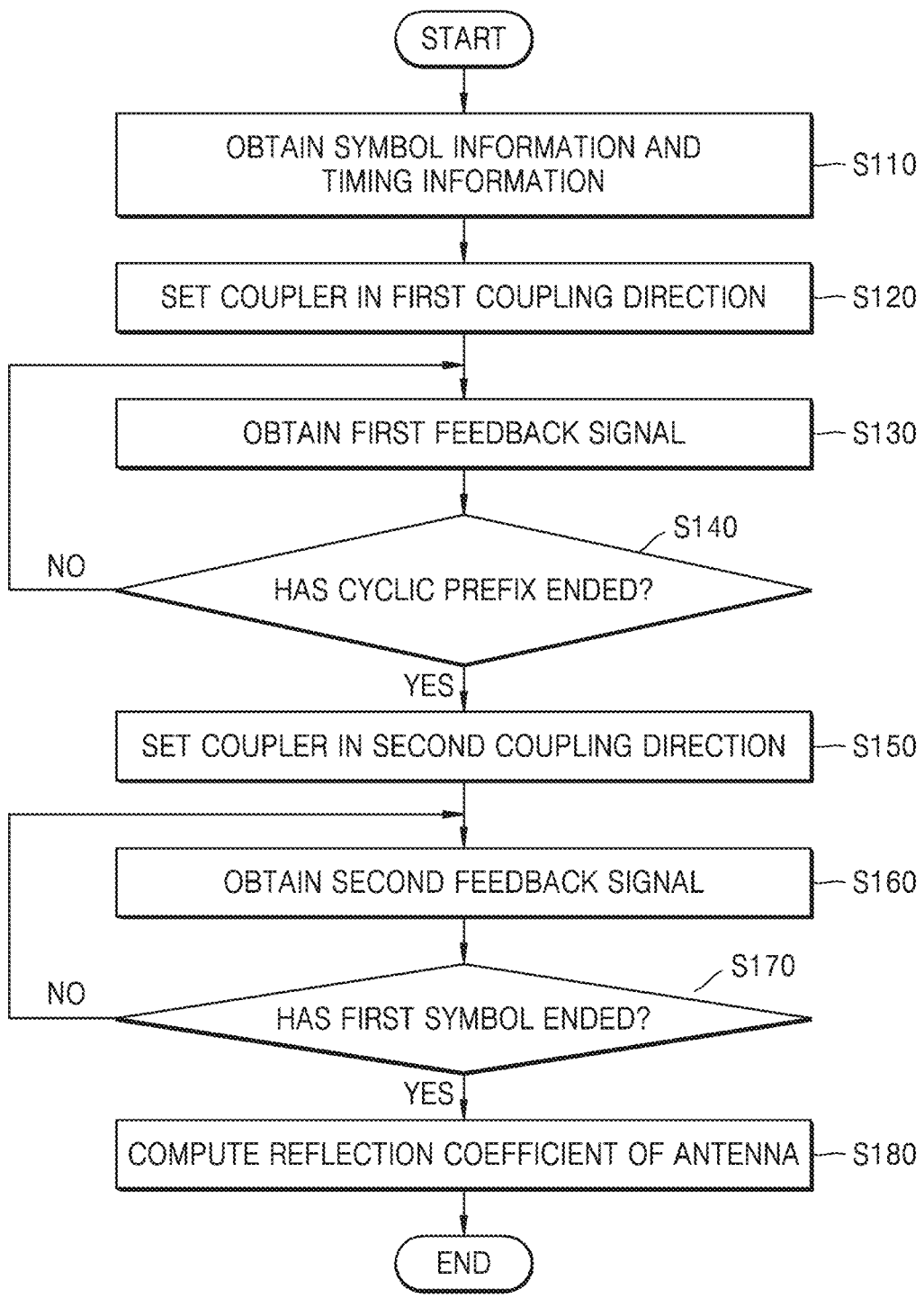
FIG. 3 is a flowchart of a method of measuring a reflection coefficient of an antenna using the wireless communication device of FIG. 1, according to an example embodiment of the inventive concepts.

FIG. 3 is a flowchart of a method of measuring the reflection coefficient Γ of the antenna 40, according to an example embodiment of the inventive concepts. In some embodiments, the method in FIG. 3 may be performed by the antenna controller 14 in FIG. 1. As illustrated in FIG. 3, the method of measuring the reflection coefficient Γ of the antenna 40 may include a plurality of operations S110 through S180. Below, FIG. 3 is described with reference to FIGS. 1 and 2.

An operation of obtaining the symbol information I_SYM and the timing information may be performed (S110). As described above with reference to FIG. 1, the antenna controller 14 may receive the symbol information I_SYM from the TX controller 11, and the symbol information I_SYM may include the length $T_{CP}$ of the cyclic prefix portion CP and the length $T_{SYM}$ of the symbol. The timing information about the symbol may, as information for detecting an interval of the first symbol SYM1, indicate the interval of the symbol and may be obtained in various manners. Examples of a method of obtaining the timing information of the symbol are described below with reference to FIGS. 6 through 10. Accordingly, the antenna controller 14 may determine, based on the symbol information I_SYM and the timing information, not only a timing to change the coupling direction of the coupler 31 but also intervals in which the cyclic prefix portion CP and the back-end portion BE may be captured.

An operation of setting the coupler 31 in the first coupling direction may be performed (S120). For example, the coupler 31 may be set in the forward coupling F, and accordingly, may provide to the feedback circuit 50 the signal coupled with the RF transmit signal TX_RF as the RF feedback signal RF_FB. On the other hand, the coupler 31 may be set in the reverse coupling R, and accordingly, may provide to the feedback circuit 50 the signal reflected from the antenna 40 as the RF feedback signal RF_FB.

An operation of obtaining a first feedback signal may be performed (S130). For example, the feedback circuit 50 may receive the RF feedback signal RF_FB from the coupler 31 that has been set in the first coupling direction (e.g., in operation S120) and provide the feedback signal S_FB to the buffer 13 of the controller 10 by processing the RF feedback signal RF_FB. The buffer 13 may capture the feedback signal S_FB received from the feedback circuit 50 as the first feedback signal. Accordingly, the first feedback signal may correspond to the RF transmit signal TX_RF when the coupler 31 is set in the forward coupling F in operation S120, while the first feedback signal is capable of corresponding to a signal reflected from the antenna 40 when the coupler 31 is set in the reverse coupling R. In some embodiments, the antenna controller 14 may control the buffer 13 to capture the first feedback signal.

An operation of determining whether the cyclic prefix portion CP has ended may be performed (S140). For example, the antenna controller 14 may estimate an end of the cyclic prefix portion CP based on the symbol information I_SYM and the timing information that are obtained in operation S110, and based on the estimated end of the cyclic prefix portion CP, may determine whether the cyclic prefix portion CP of the first symbol SYM1 included in the RF transmit signal TX_RF provided to the coupler 31 has ended. As illustrated in FIG. 3, when the cyclic prefix portion CP is not terminated, an operation of obtaining the first feedback signal may be continued in operation S130, and when the cyclic prefix portion CP has ended, operation S150 may be successively performed. Accordingly, the first feedback signal may obtain a first feedback signal including at least a portion of the cyclic prefix portion CP from the coupler 31 which is set in the first coupling direction. In some embodiments, the antenna controller 14 may control the buffer 13 to terminate capturing of the first feedback signal when the cyclic prefix portion CP has ended.

When the cyclic prefix portion CP has ended, an operation of setting the coupler 31 in the second coupling direction may be performed (S150). The second coupling direction of operation S150 may be different from the first coupling direction of operation S120. For example, when the coupler 31 is set in the forward coupling F in operation S120, the coupler 31 may be set in the reverse coupling R in operation S150, while, when the coupler 31 is set in the reverse coupling R in operation S120, the coupler 31 may be set in the forward coupling F in operation S150.

An operation of obtaining the second feedback signal may be performed (S160). For example, the feedback circuit 50 may receive the RF feedback signal RF_FB from the coupler 31 that is set in the second coupling direction in operation S150 and may provide the feedback signal S_FB to the buffer 13 by processing the RF feedback signal RF_FB. The buffer 13 may capture the feedback signal S_FB received from the feedback circuit 50 as the second feedback signal. Accordingly, the second feedback signal may correspond to the RF transmit signal TX_RF when the coupler 31 is set in the forward coupling F in operation S150, while the second feedback signal is capable of corresponding to the signal reflected from the antenna 40 when the coupler 31 is set in the reverse coupling R in operation S150. In some embodiments, the antenna controller 14 may control the buffer 13 to capture the second feedback signal.

An operation of determining whether the first symbol SYM1 has ended may be performed (S170). For example, the antenna controller 14 may estimate the end of the first symbol SYM1 based on the symbol information I_SYM and the timing information that are obtained in operation S110, and based on the estimated end of the first symbol SYM1, may determine whether the first symbol SYM1 included in the RF transmit signal TX_RF provided to the coupler 31 has ended. As illustrated in FIG. 3, when the first symbol SYM1 has not ended, an operation of obtaining the second feedback signal may continue in operation S160, while, when the first symbol SYM1 has ended, operation S180 may be successively performed. Thus, the second feedback signal may obtain a second feedback signal including at least a portion of the back-end portion BE of the first symbol SYM1 from the coupler 31 that is set in the second coupling direction. In some embodiments, the antenna controller 14 may control the buffer 13 to terminate capturing of the second feedback signal when the first symbol SYM1 has ended.

When the first symbol SYM1 has ended, an operation of computing the reflection coefficient of the antenna 40 based on the first feedback signal and the second feedback signal may be performed (S180). For example, the antenna controller 14 may obtain the first feedback signal and the second feedback signal from the feedback data D_FB provided from the buffer 13, and based on the first feedback signal and the second feedback signal, may compute the reflection coefficient of the antenna 40, for example, as in (e.g., using) Formula 1. As described below with reference to FIG. 17, the antenna controller 14 may perform an operation of controlling the antenna tuner 32 and/or detecting an external object of the wireless communication device 5 based on the computed reflection coefficient.

Figure 4:
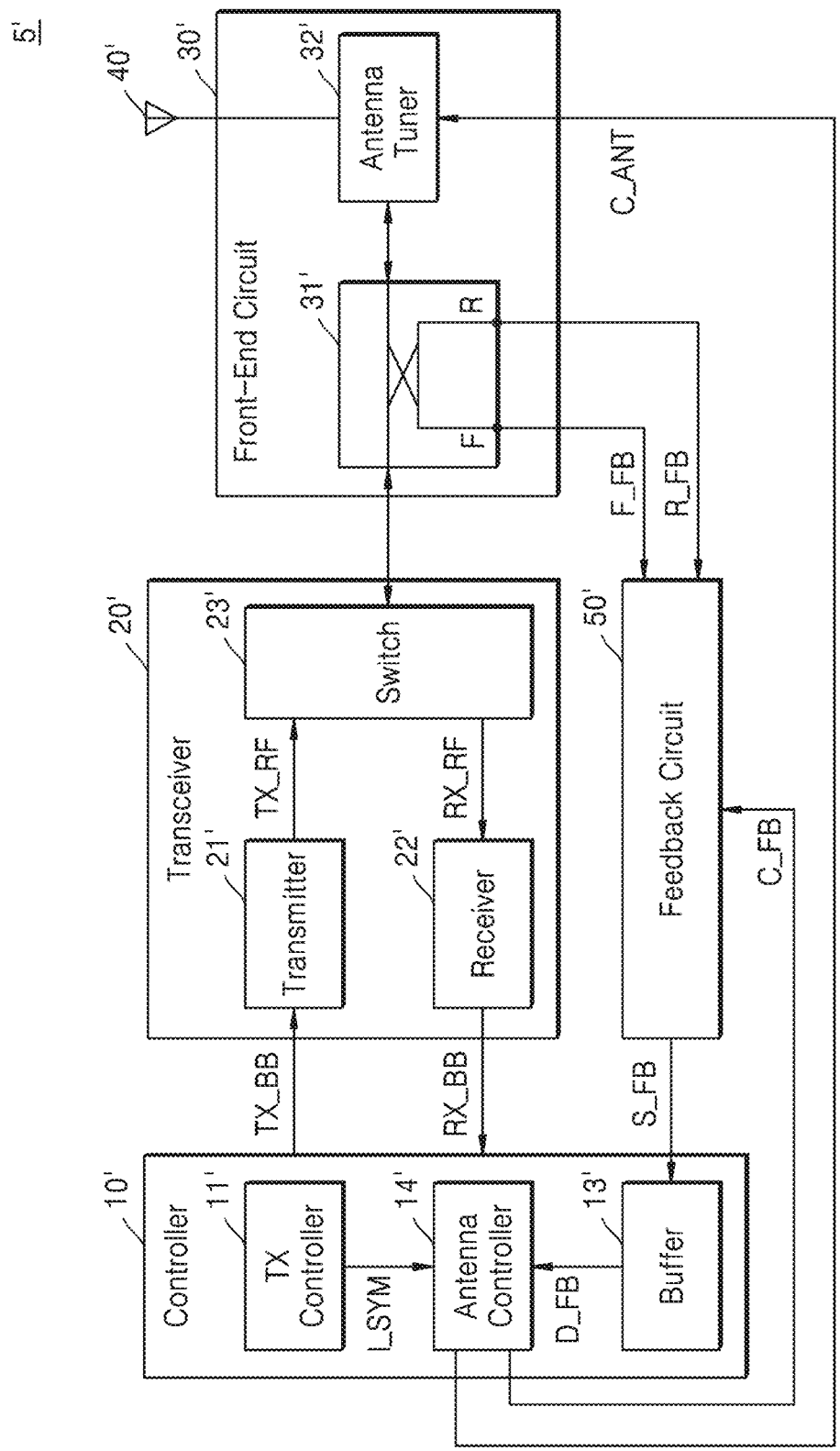
FIG. 4 is a block diagram of a wireless communication device including a coupler configured to contemporaneously output a forward feedback signal and a reverse feedback signal, according to an example embodiment of the inventive concepts.

FIG. 4 is a block diagram of a wireless communication device 5', according to an example embodiment of the inventive concepts. As illustrated in FIG. 4, the wireless communication device 5' of FIG. 4 may include a controller 10', a transceiver 20', a front-end circuit 30', an antenna 40', and/or a feedback circuit 50'. Compared with the wireless communication device 5 of FIG. 1, the coupler 31' in the wireless communication device 5' of FIG. 4 may simultaneously or contemporaneously generate a signal coupled with the RF transmit signal TX_RF and a signal reflected from the antenna 40'. Hereinafter, descriptions of FIG. 4 that are the same as or similar to those given with reference to FIG. 1 are omitted.

The front-end circuit 30' may include the coupler 31' and/or an antenna tuner 32'. The coupler 31' may simultaneously or contemporaneously provide the feedback circuit 50' with the signal coupled with the RF transmit signal TX_RF and the signal reflected from the antenna 40'. For example, the coupler 31' may receive the RF transmit signal TX_RF from the transceiver 20' in a transmit mode, transmit a forward feedback signal F_FB as the signal coupled with the RF transmit signal TX_RF to the feedback circuit 50', and provide a reverse feedback signal R_FB as the signal reflected from the antenna 40' to the feedback circuit 50'. Accordingly, unlike the coupler 31 in FIG. 1, a signal for controlling a coupling direction of the coupler 31' in FIG. 4 that is provided from the antenna controller 14' of the controller 10' may be omitted.

The transceiver 20' may include a transmitter 21', a receiver 22', and/or a switch 23'. The transmitter 21' may generate the RF transmit signal TX_RF by processing the baseband transmit signal TX_BB, and the receiver 22' may generate the baseband receive signal RX_BB by processing the RF receive signal RX_RF. The controller 10' may include a transmission controller 11', a buffer 13', and/or an antenna controller 14'. The transmission controller 11' may control a transmit operation and may provide the symbol information I_SYM to the antenna controller 14'. The buffer 13' may capture the feedback signal S_FB received from the feedback circuit 50' and provide the feedback data D_FB to the antenna controller 14'.

The antenna controller 14' may measure a reflection coefficient of the antenna 40' based on the symbol information I_SYM, timing information, and/or the feedback data D_FB. As illustrated in FIG. 4, the antenna controller 14' may provide an antenna tuning signal CANT to the antenna tuner 32' to adjust an impedance of the antenna tuner 32' based on the measured reflection coefficient of the antenna 40'. In addition, the antenna controller 14' may provide the feedback control signal C_FB to the feedback circuit 50', and the feedback circuit 50' may generate the feedback signal S_FB by processing one of the forward feedback signal F_FB and/or the reverse feedback signals R_FB according to the feedback control signal C_FB. In other words, the antenna controller 14 in FIG. 1 may control the coupling direction of the coupler 31 by using the coupler control signal included in the front-end control signal C_FE, while the antenna controller 14' in FIG. 4 may, by using the feedback control signal C_FB, control the buffer 13' to capture the feedback signal S_FB corresponding to one of the forward feedback signal F_FB and/or the reverse feedback signal R_FB. According to some example embodiments, operations described herein as being performed by the wireless communication device 5', the controller 10', the transceiver 20', the front-end circuit 30', the feedback circuit 50', the antenna tuner 32', the transmitter 21', the receiver 22', the TX controller 11' and/or the antenna controller 14' may be performed by processing circuitry.

Figure 5:
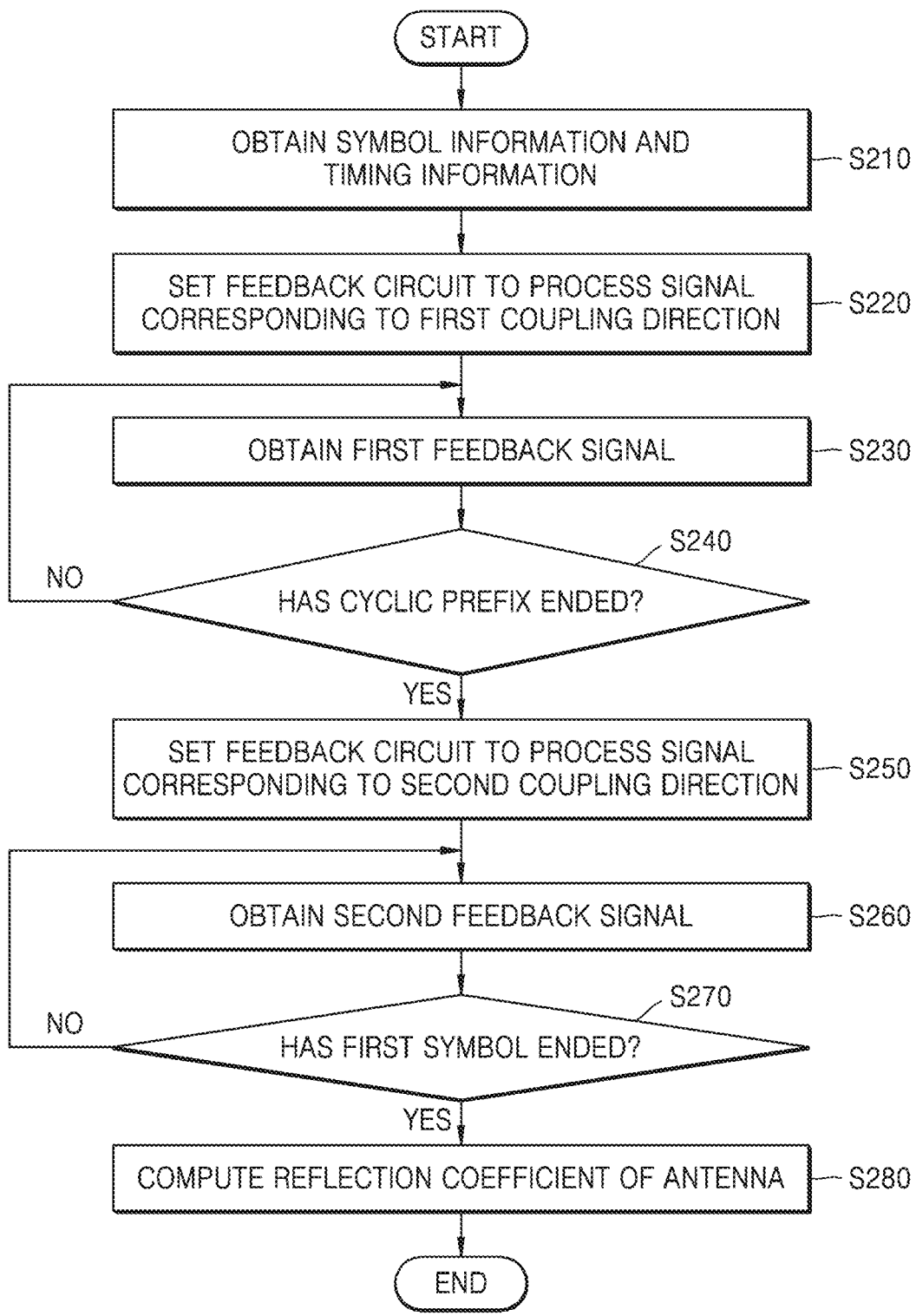
FIG. 5 is a flowchart of a method of measuring a reflection coefficient of an antenna using the wireless communication device of FIG. 4, according to an example embodiment of the inventive concepts.

FIG. 5 is a flowchart of a method of measuring a reflection coefficient of the antenna 40', according to an example embodiment of the inventive concepts. In some embodiments, operations in FIG. 5 may be performed by the antenna controller 14' in FIG. 4. As illustrated in FIG. 5, the method of measuring the reflection coefficient of the antenna 40' may include a plurality of operations S210 through S280. Hereinafter, FIG. 5 is described with reference to FIG. 4, and descriptions previously given with reference to FIG. 3 are omitted.

An operation of obtaining the symbol information I_SYM and the timing information may be performed (S210). Next, the feedback circuit 50' may be configured to process the signal corresponding to the first coupling direction (S220). For example, the antenna controller 14' may generate the feedback signal S_FB by using the feedback control signal C_FB to process the forward feedback signal F_FB or the reverse feedback signal R_FB.

An operation of obtaining the first feedback signal may be performed (S230). The buffer 13' may capture the feedback signal S_FB received from the feedback circuit 50' as the first feedback signal. Accordingly, the first feedback signal may correspond to the RF transmit signal TX_RF when the feedback circuit 50' is set to process the forward feedback signal F_FB in operation S220, but the first feedback signal may correspond to a signal reflected from the antenna 40' when the feedback circuit 50' is set to process the reverse feedback signal R_FB in operation S220. Next, an operation of determining whether the cyclic prefix portion CP has ended may be performed (S240). When the cyclic prefix portion CP has not ended, operation S230 may be performed subsequently, but, when the cyclic prefix portion CP has ended, operation S250 may be performed subsequently, and accordingly, the first feedback signal may include at least a portion of the cyclic prefix portion CP.

A feedback circuit may be configured to process the signal corresponding to the second coupling direction (S250). For example, the antenna controller 14' may, by using the feedback control signal C_FB, be set to process the reverse feedback signal R_FB when the feedback circuit 50' is set to process the forward feedback signal F_FB in operation S220, but the antenna controller 14' may be set to process the forward feedback signal F_FB when the feedback circuit 50' is set to process the reverse feedback signal R_FB in operation S220.

An operation of obtaining the second feedback signal may be performed (S260). For example, the buffer 13' may capture the feedback signal S_FB received from the feedback circuit 50' as the second feedback signal. Accordingly, the second feedback signal may correspond to the RF transmit signal TX_RF when the feedback circuit 50' is set to process the forward feedback signal F_FB in operation S250, but the second feedback signal may correspond to a signal reflected from the antenna 40' when the feedback circuit 50' is set to process the reverse feedback signal R_FB in operation S250. Next, an operation of determining whether the first symbol SYM1 has ended may be performed (S270). When the first symbol SYM1 has not ended, operation S260 may be performed subsequently, and accordingly, the second feedback signal may include at least some of the back-end portion BE. When the first symbol SYM1 has ended, an operation of computing the reflection coefficient of the antenna 40' based on the first feedback signal and the second feedback signal may be performed (S280).

Hereinafter, example embodiments of the inventive concepts are described with reference to the wireless communication device 5 including the coupler 31 in which a coupling direction is switched by the antenna controller 14, as illustrated in FIG. 1. However, the inventive concepts are not limited thereto, and it will be understood that embodiments described below are also applicable to the wireless communication device 5' including the coupler 31', as illustrated in FIGS. 4 and 5.

Figure 6:
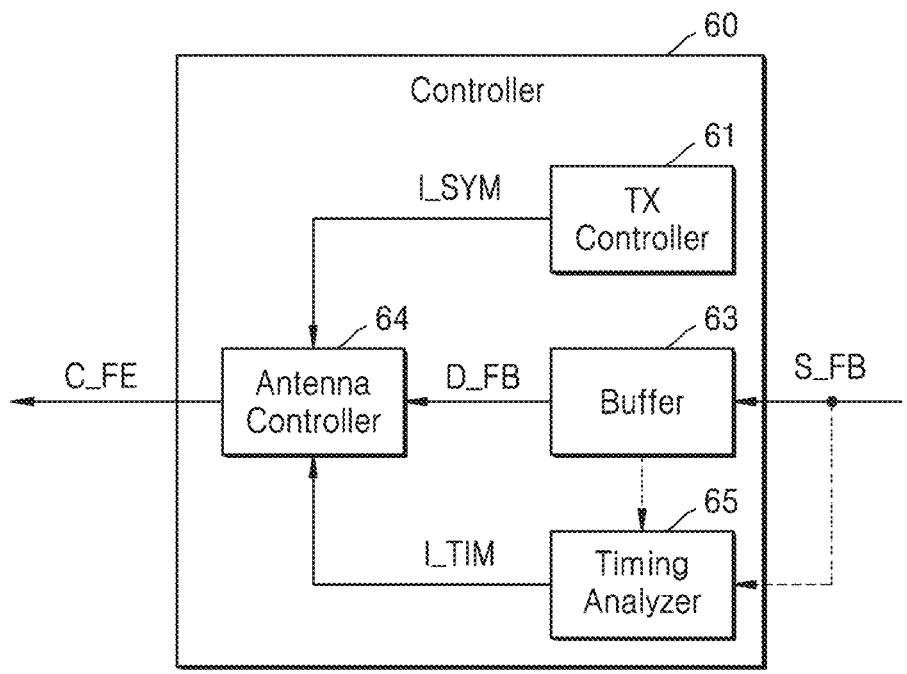
FIG. 6 is a block diagram of an example of a controller including a timing analyzer, according to an example embodiment of the inventive concepts.

FIG. 6 is a block diagram of an example of a controller 60, according to an example embodiment of the inventive concepts. The controller 60 of FIG. 6 may, similar to the controller 10 in FIG. 1, include a TX controller 61, a buffer 63, and/or an antenna controller 64, and may further include a timing analyzer 65. Hereinafter, descriptions of FIG. 6 that are the same as or similar to those given with reference to FIG. 1 are omitted. According to some example embodiments, operations described herein as being performed by the controller 60, the TX controller 61, the antenna controller 64 and/or the timing analyzer 65 may be performed by processing circuitry.

The timing analyzer 65 may generate timing information I_TIM and provide the timing information I_TIM to the antenna controller 64. As illustrated by a dashed line in FIG. 6, the timing analyzer 65 may, in some embodiments, receive the feedback signal S_FB, and in some embodiments, may receive the feedback data D_FB that the buffer 63 provides to the antenna controller 64 by capturing the feedback signal S_FB. The timing analyzer 65 may detect a boundary of the first symbol SYM1 from the feedback signal S_FB including the cyclic prefix portion CP and the back-end portion BE. In some embodiments, the antenna controller 14 may detect a boundary of at least one symbol preceding the first symbol SYM1, for example, a boundary of the second symbol SYM2 of FIG. 2, and may control the coupling direction of the coupler 31 in the first symbol SYM1 based on the detected boundary of the second symbol SYM2 and the symbol information I_SYM. An example of an operation of the timing analyzer 65 is described below with reference to FIG. 7. Accordingly, the antenna controller 64 may measure the reflection coefficient of an antenna (for example, the antenna 40 in FIG. 1), based on the symbol information I_SYM received from the transmission controller 61, the feedback data D_FB received from the buffer 63, and/or the timing information I_TIM received from the timing analyzer 65.

Figure 7:
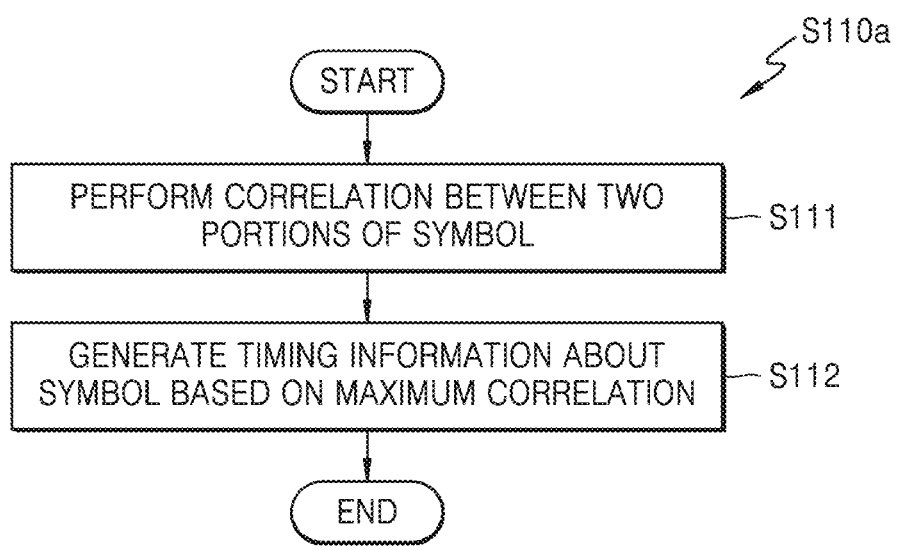
FIG. 7 is a flowchart of an example of operation S110 in FIG. 3 performed using the timing analyzer of FIG. 6, according to an example embodiment of the inventive concepts.

FIG. 7 is a flowchart for explaining an example of operation S110 in FIG. 3, according to an example embodiment of the inventive concepts. An operation of generating the timing information I_TIM of a symbol may be performed (S110a of FIG. 7). In some embodiments, operation S110a of FIG. 7 may be an example of operation S210 of FIG. 5. In addition, in some embodiments, operation S110a of FIG. 7 may be performed by the timing analyzer 65 in FIG. 6, and hereinafter, FIG. 7 is described with reference to FIG. 6.

Referring to FIG. 7, an operation of performing (e.g., determining) a correlation between two portions of the symbol may be performed (S111). According to some example embodiments, a plurality of correlations between the two portions of the symbol may be performed. Next, an operation of generating the timing information I_TIM of the symbol based on the maximum (e.g., highest or high) correlation may be performed (S112). According to some example embodiments, the maximum correlation may be determined from among the plurality of correlations performed in operation S111. The timing analyzer 65 may perform the operation of correlation of a portion including the cyclic prefix portion CP of the symbol and a portion including the back-end portion BE of the symbol, and accordingly, the boundary of the symbol may be detected based on a point where the highest correlation or a high correlation is found. Accordingly, the timing analyzer 65 may provide the antenna controller 64 with the timing information I_TIM including the detected boundary of the symbol.

Figure 8:
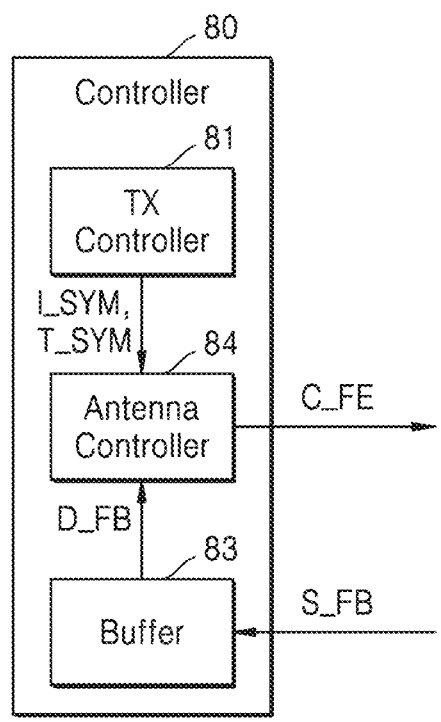
FIG. 8 is a block diagram of an example of a controller including an antenna controller configured to generate timing information I_TIM, according to an example embodiment of the inventive concepts.

FIG. 8 is a block diagram of an example of a controller 80, according to an example embodiment of the inventive concepts. The controller 80 of FIG. 8 may, similar to the controller 10 in FIG. 1, include a transmission controller 81, a buffer 83, and/or an antenna controller 84, and the transmission (TX) controller 81 may provide the timing signal T_SYM of the symbol to the antenna controller 84. Hereinafter, FIG. 8 will be described with reference to FIG. 1. According to some example embodiments, operations described herein as being performed by the controller 80, the TX controller 81 and/or the antenna controller 84 may be performed by processing circuitry.

The antenna controller 84 may receive the symbol information I_SYM and the timing signal T_SYM of the symbol from the transmission controller 81 and receive the feedback data D_FB from the buffer 83. As described above, the symbol information I_SYM may include the length $T_{CP}$ of the cyclic prefix portion CP and the length $T_U$ of the data symbol, and the timing signal T_SYM of the symbol may represent the boundary of the symbol included in the baseband transmit signal TX_BB. The antenna controller 84 may know delays of paths in advance (e.g., the transmission path delay of the wireless communication device 5, the transmission path delay of the wireless communication device 5', etc.), recognize the boundary of the symbol based on the timing signal T_SYM and the delays of the paths, and generate the timing information I_TIM indicating the boundary of the symbol. An example of the operation in which the antenna controller 84 generates the timing information I_TIM based on the timing signal T_SYM is described below with reference to FIG. 9.

Figure 9:
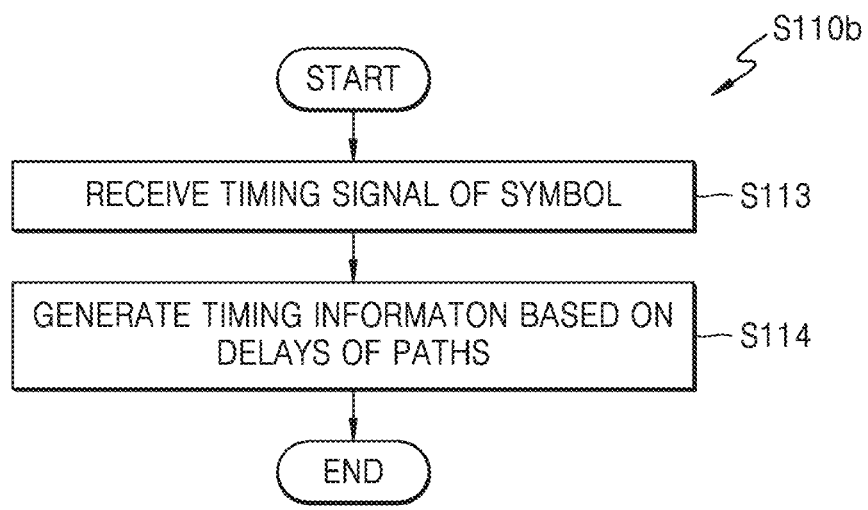
FIG. 9 is a flowchart of an example of operation S110 in FIG. 3 performed using the antenna controller of FIG. 8, according to an example embodiment of the inventive concepts.

FIG. 9 is a flowchart for explaining an example of operation S110 in FIG. 3, according to an example embodiment of the inventive concepts. An operation of generating the timing information I_TIM of the symbol may be performed (S110b of FIG. 9). In some embodiments, operation S110b of FIG. 9 may be an example of operation S210 of FIG. 5. In addition, in some embodiments, operation S110b of FIG. 9 may be performed by the antenna controller 84 in FIG. 8, and hereinafter, FIG. 9 is described with reference to FIGS. 1 and 8.

Referring to FIG. 9, an operation of receiving the timing signal T_SYM of the symbol may be performed (S113), and then, an operation of generating the timing information I_TIM based on the delays of the paths may be performed (S114). For example, as described above with reference to FIG. 8, the timing signal T_SYM may be a signal synchronized to the boundary of the first symbol SYM1, and accordingly, the timing information indicating the boundary of the symbol may be generated based on the timing signal T_SYM and the delays of the paths.

In some embodiments, the antenna controller 84 may estimate the boundary of the symbol that reaches the coupler 31 based on the timing signal T_SYM of the symbol. For example, the antenna controller 84 may know in advance a path in which the first symbol SYM1 included in the baseband transmit signal TX_BB passes through the transmitter 21 and the switch 23 and reaches the coupler 31, that is, the delay of the transmit path, and accordingly, may estimate a time point at which the boundary of the first symbol SYM1 reaches the coupler 31 based on the timing signal T_SYM of the symbol and the delay of the transmit path.

In some embodiments, the antenna controller 84 may estimate the boundary of the symbol included in the feedback signal S_FB based on the timing signal T_SYM of the symbol. For example, the antenna controller 84 may know in advance a delay of a path where the RF feedback signal RF_FB provided by the coupler 31 is processed by the feedback circuit 50 to be generated as the feedback signal S_FB, that is, the delay of the feedback path, and accordingly, may estimate a time point at which the boundary of the first symbol SYM1 reaches the buffer 13 based on the timing signal T_SYM of the symbol, the delay of the transmit path, and the delay of the feedback path.

Figure 10:
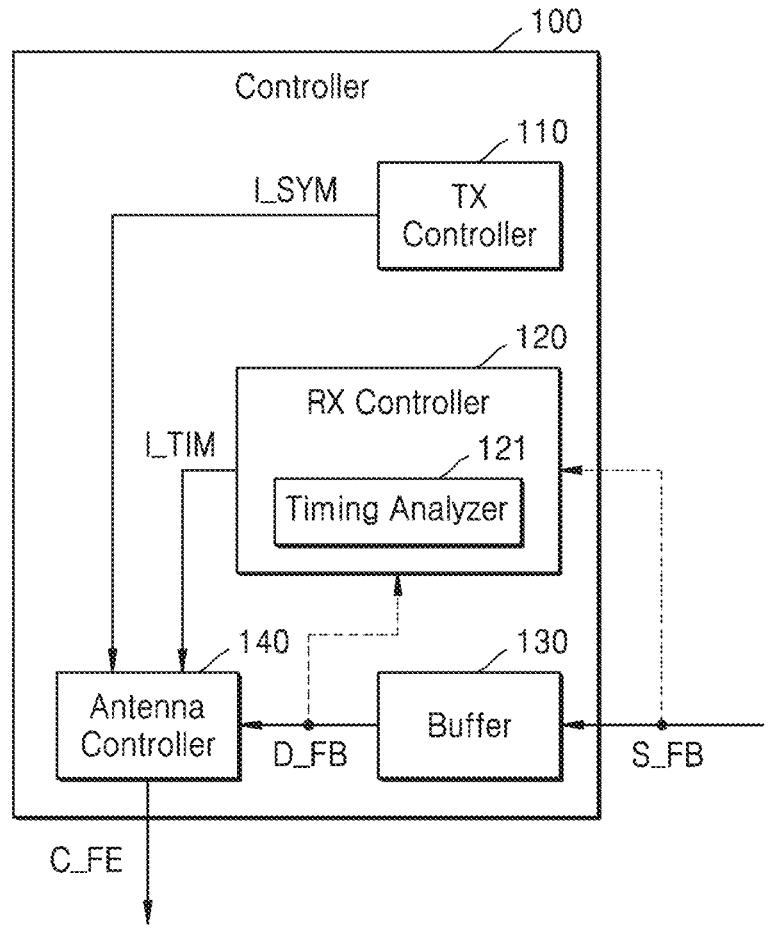
FIG. 10 is a block diagram of an example of a controller including a receive controller, according to an example embodiment of the inventive concepts.

FIG. 10 is a block diagram of an example of a controller 100, according to an example embodiment of the inventive concepts. The controller 100 of FIG. 10 may, similar to the controller 10 in FIG. 1, include a TX controller 110, a buffer 130, and/or an antenna controller 140, and may further include a receive (RX) controller 120 (e.g., a reception (RX) controller). Hereinafter, descriptions of FIG. 10 that are the same as or similar to those given with respect to FIG. 1 are omitted.

The RX controller 120 may control reception via the receiver 22. For example, the RX controller 120 may set various reception parameters and control the receiver 22 included in the transceiver 20, such that the RF receive signal RX_RF and the baseband receive signal RX_BB are processed according to a wireless communication system to which the wireless communication device 5 is connected and/or a counterpart wireless communication device. As illustrated in FIG. 10, the RX controller 120 may include a timing analyzer 121 for processing the baseband receive signal RX_BB. Similar to descriptions above with reference to FIG. 6, the timing analyzer 121 included in the RX controller 120 may be used to detect the boundary of the symbol in the baseband receive signal RX_BB. According to some example embodiments, operations described herein as being performed by the controller 100, the TX controller 110, the antenna controller 140, the RX controller 120 and/or the timing analyzer 121 may be performed by processing circuitry.

In some embodiments, the reception (RX) controller 120 may, as illustrated by the dashed line in FIG. 10, receive the feedback signal S_FB or the feedback data D_FB. While measuring the reflection coefficient of the antenna 40, the transceiver 20 may operate in the transmit mode, and accordingly, the timing analyzer 121 of the RX controller 120 may be in an idle state without processing the baseband receive signal RX_BB. Thus, the timing analyzer 121 included in the RX controller 120 may be shared (e.g., used) for measuring the reflection coefficient of the antenna 40. An example of the operation in which the timing information I_TIM is generated in the controller 100 of FIG. 10 is described below with reference to FIG. 12.

Figure 11:
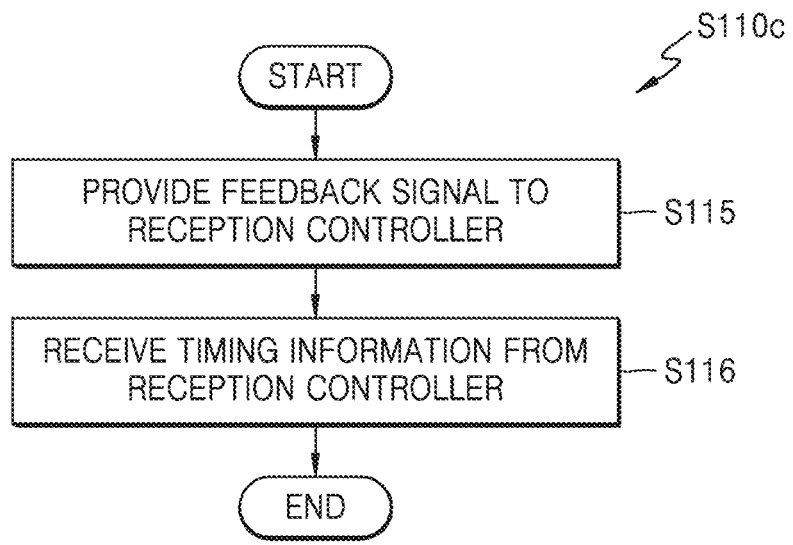
FIG. 11 is a flowchart of an example of operation S110 in FIG. 3 performed using the receive controller of FIG. 10, according to an example embodiment of the inventive concepts.

FIG. 11 is a flowchart for explaining an example of operation S110 in FIG. 3, according to an example embodiment of the inventive concepts. An operation of generating the timing information I_TIM of the symbol may be performed (S110c of FIG. 11). In some embodiments, operation S110c of FIG. 11 may be an example of operation S210 of FIG. 5. In addition, in some embodiments, operation S110c of FIG. 11 may be performed by the antenna controller 140 in FIG. 10, and hereinafter, FIG. 11 is described with reference to FIGS. 1 and 10.

Referring to FIG. 11, an operation of providing the feedback signal S_FB to the RX controller 120 may be performed (S115), and then, an operation of receiving the timing information I_TIM from the RX controller 120 may be performed (S116). For example, as described above with reference to FIG. 10, the timing analyzer 121 of the RX controller 120 may be used to measure the reflection coefficient of the antenna 40, and accordingly, the antenna controller 140 may obtain the timing information I_TIM indicating the boundary of the symbol included in the feedback signal S_FB from the timing analyzer 121 by providing the RX controller 120 with the feedback signal S_FB (or the feedback data D_FB). According to some example embodiments, the antenna controller 140 may control the RX controller 120 to generate (e.g., determine)

the timing information I_TIM (e.g., by providing the RX controller 120 with the feedback signal S_FB).

Figure 12:
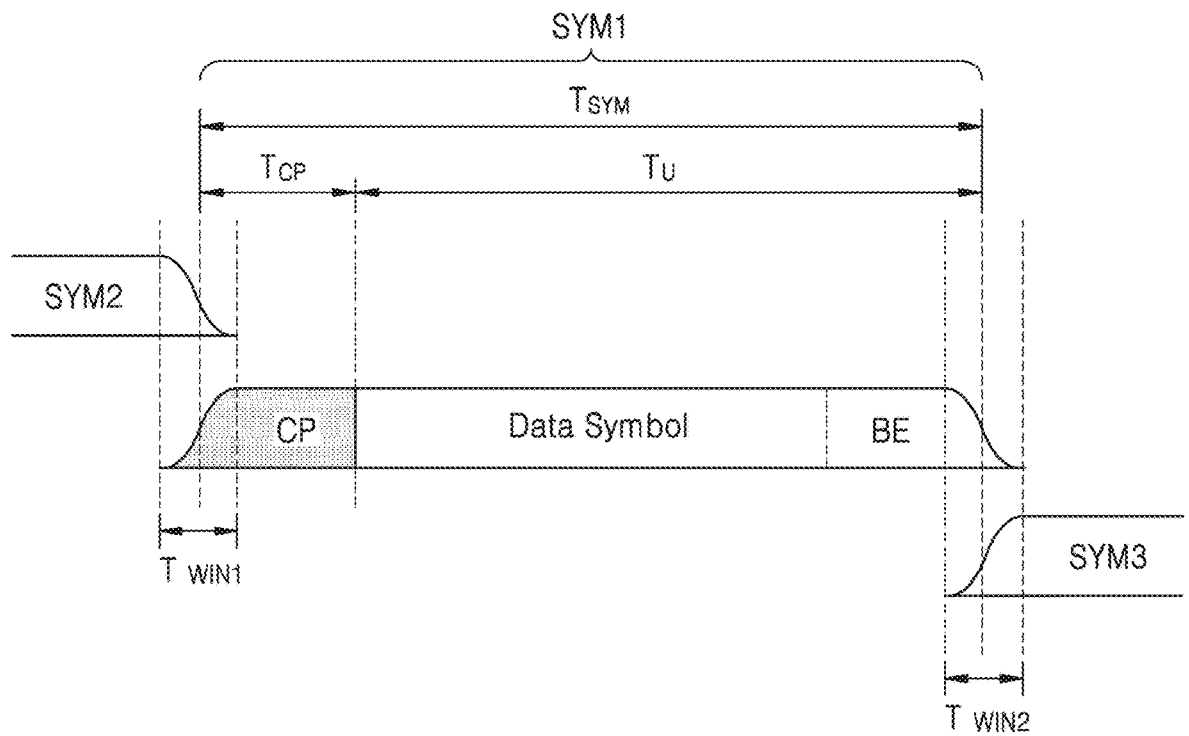
FIG. 12 is a timing diagram of symbols included in a transmit signal, according to an example embodiment of the inventive concepts.

FIG. 12 is a timing diagram of first through third symbols SYM1 through SYM3 included in a transmit signal, according to an example embodiment of the inventive concepts. FIG. 12 illustrates the second symbol SYM2, the first symbol SYM1, and the third symbol SYM3 successively and individually. Hereinafter, FIG. 12 is described with reference to FIG.

Windowing may be used to prevent or reduce spectral leakage due to phase discontinuity between successive symbols. For example, as illustrated in FIG. 12, a first windowing interval $T_{WIN1}$ may occur in which a portion of the first symbol SYM1 and a portion of the second symbol SYM2 are distorted near a boundary between the first symbol SYM1 and the second symbol SYM2. In addition, a second windowing interval $T_{WIN2}$ may occur in which a portion of the first symbol SYM1 and a portion of the third symbol SYM3 are distorted near a boundary between the first symbol SYM1 and the third symbol SYM3. The windowing may be applied at a time of generating the baseband transmit signal TX_BB, and accordingly, a series of symbols included in the baseband transmit signal TX_BB may be distorted near the boundaries between the symbols. Since mutually matching signals are used to measure the reflection coefficient of the antenna 40, as to be described below with reference to FIG. 13, a windowing interval of the feedback signal S_FB, for example, a portion corresponding to the first windowing interval $T_{WIN1}$ and a portion corresponding to the second windowing interval $T_{WIN2}$ may be excluded (e.g., removed or reduced).

Figure 13:
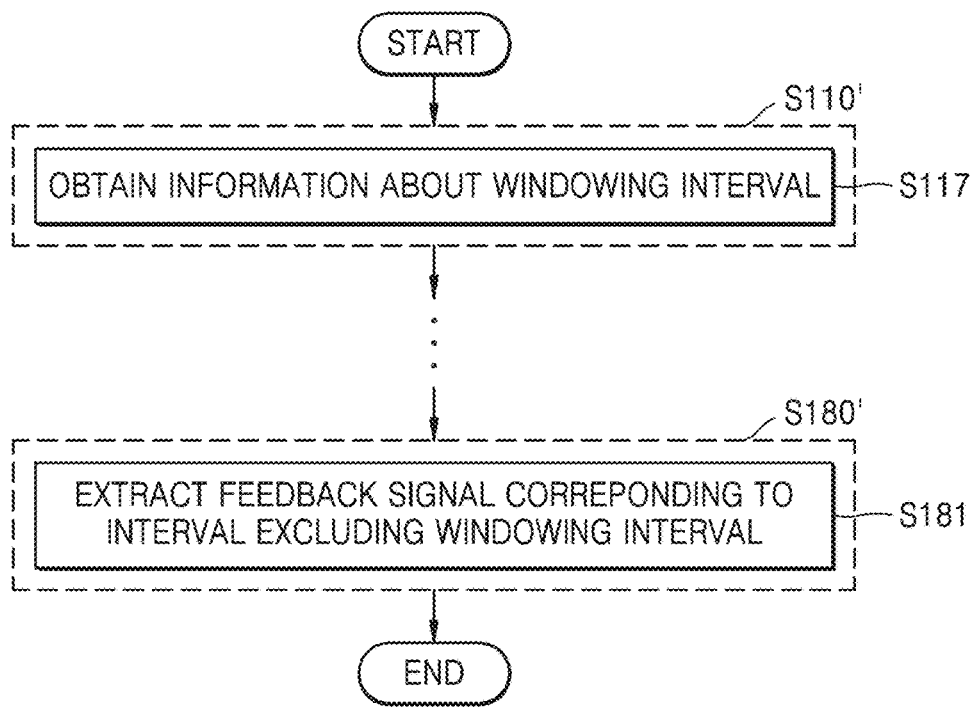
FIG. 13 is a flowchart of a method of measuring a reflection coefficient of an antenna in which a windowing interval is excluded from a feedback signal, according to an example embodiment of the inventive concepts.

FIG. 13 is a flowchart of a method of measuring the reflection coefficient of the antenna 40, according to an example embodiment of the inventive concepts. FIG. 13 illustrates examples of operations S110 and S180 in FIG. 3. As described above with reference to FIG. 3, an operation of obtaining the symbol information I_SYM and the timing information I_TIM may be performed (S110' of FIG. 13), and an operation of computing the reflection coefficient of the antenna 40 may be performed (S180' of FIG. 13). Hereinafter, FIG. 13 is described with reference to FIGS. 3 and 12.

Referring to FIG. 13, operation S110' may include operation S117. An operation of obtaining information about the windowing interval may be performed (S117). As described above with reference to FIG. 12, the windowing may be applied at the time of generating the baseband transmit signal TX_BB, and the TX controller 11 may control the windowing. Accordingly, the antenna controller 14 may obtain information about the windowing interval from the TX controller 11. For example, the symbol information I_SYM in FIG. 1 may include not only the length $T_{CP}$ of the cyclic prefix portion CP and the length $T_{SYM}$ of the symbol but also information about the windowing interval, for example, a length and/or position of the windowing interval.

Operation S180' may include operation S181. An operation of extracting a feedback signal corresponding to an interval excluding the windowing intervals may be performed (S181). As described above with reference to FIG. 3, prior to operation S180', the first feedback signal including at least a portion of the cyclic prefix portion CP and a second feedback signal including at least a portion of the back-end portion BE may be obtained. As described above with reference to FIG. 12, since mutually matching signals are used to measure the reflection coefficient of the antenna 40, a portion corresponding to an interval in which a windowing interval (for example, $T_{WIN1}$ in FIG. 12) has been excluded from the first feedback signal may be extracted, and a portion corresponding to an interval in which a windowing interval (for example, $T_{WIN2}$ in FIG. 12) has been excluded from the second feedback signal may be extracted. The antenna controller 14 may compute the reflection coefficient of the antenna 40 based on the extracted portions.

Figure 14:
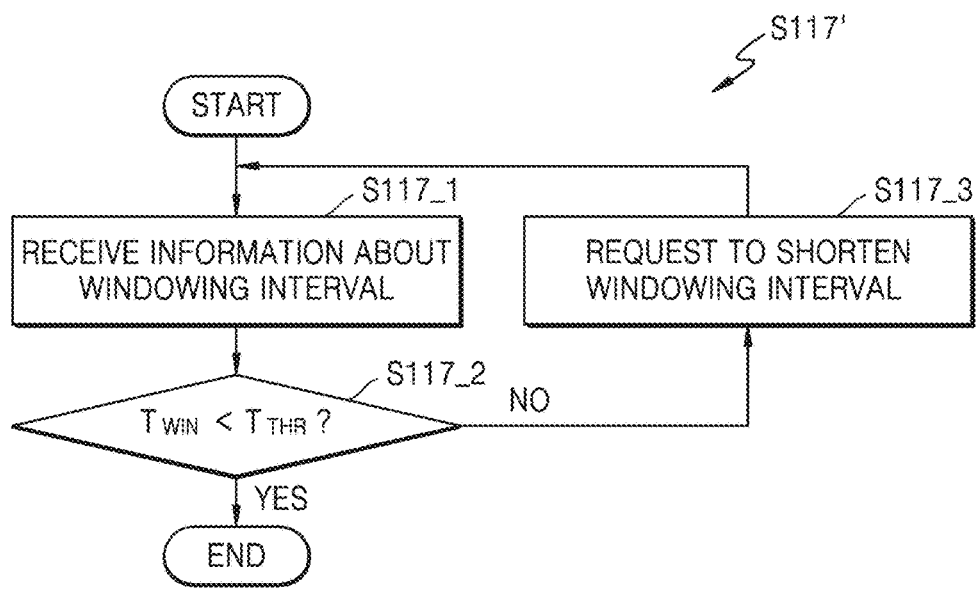
FIG. 14 is a flowchart of an example of operation S117 in FIG. 13, according to an example embodiment of the inventive concepts.

FIG. 14 is a flowchart for explaining an example of operation S117 in FIG. 13, according to an example embodiment of the inventive concepts. As described above with reference to FIG. 13, an operation of obtaining information about the windowing interval may be performed in operation S117' of FIG. 14. As illustrated in FIG. 14, operation S117' may include operations S117_1, S117_2, and S117_3, and hereinafter, FIG. 14 is described with reference to FIG. 1.

An operation of obtaining information about the windowing interval may be performed (S117_1). For example, the antenna controller 14 may receive the symbol information I_SYM including the information about the windowing interval from the TX controller 11, and/or obtain information about the windowing interval from the symbol information I_SYM.

An operation of comparing the length $T_{WIN}$ of the windowing interval with a threshold value $T_{THR}$ may be performed (S117_2). For example, the antenna controller 14 may obtain the length $T_{WIN}$ of the windowing interval as the information about the windowing interval obtained in operation S117_1 and may compare the length $T_{WIN}$ of the windowing interval with the threshold value $T_{THR}$. The threshold value $T_{THR}$ may be determined in advance based on a length of the minimum (e.g., the lowest or a low) cyclic prefix portion CP (or the back-end portion BE) by which the reflection coefficient of the antenna 40 may be computed. In other words, to compute the reflection coefficient of the antenna 40, the length $T_{WIN}$ of the windowing interval may be less than the threshold value $T_{THR}$. Accordingly, as illustrated in FIG. 14, when the length $T_{WIN}$ of the window interval is less than the threshold value $T_{THR}$, operation S117' of obtaining the information about the windowing interval may be ended, but when the length $T_{WIN}$ of the window interval is not less than the threshold value $T_{THR}$, operation S117_3 may be performed subsequently.

An operation of requesting to shorten the windowing interval may be performed (S117_3). For example, the antenna controller 14 may request the TX controller 11 to shorten the windowing interval. In response to a request from the antenna controller 14, the TX controller 11 may apply the shortened windowing interval to the baseband transmit signal TX_BB. In some embodiments, the antenna controller 14 may request the shortening of the windowing interval to the TX controller 11, and at the same time or contemporaneously, may provide a length of a desired windowing interval to the TX controller 11. In some embodiments, the TX controller 11 may know the threshold value $T_{THR}$ in advance, and in response to the request from the antenna controller 14, may apply the windowing interval that is less than the threshold value $T_{THR}$ to the baseband TX signal TX_BB.

Figure 15:
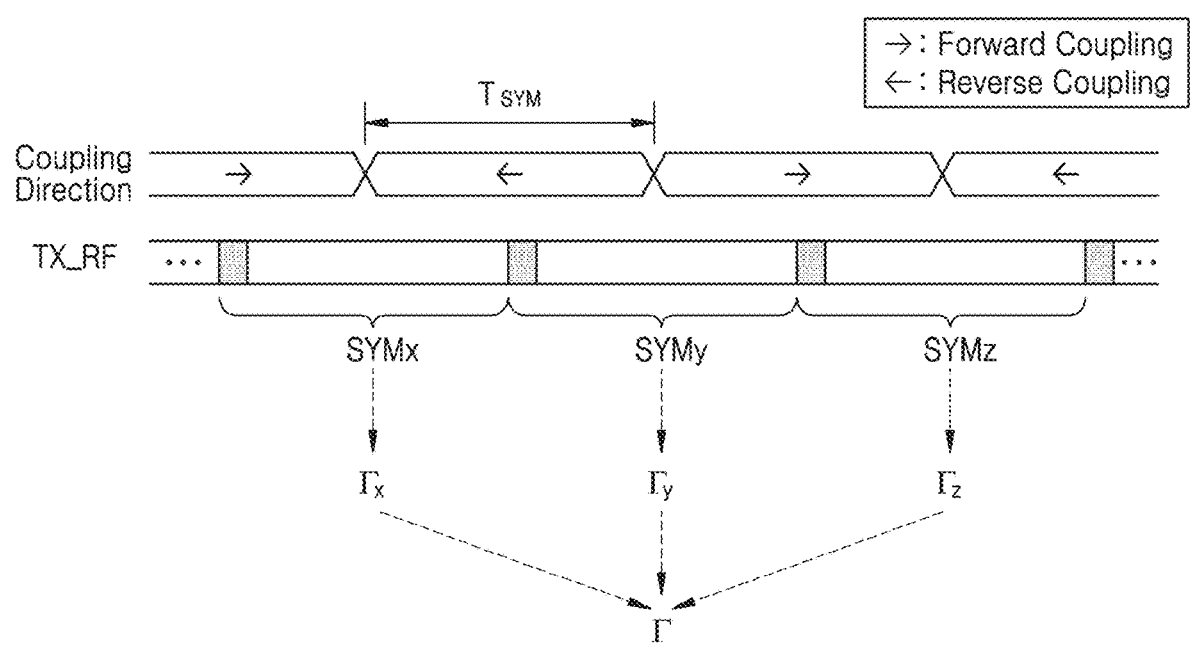
FIG. 15 is a diagram of an example of an operation of measuring a reflection coefficient of an antenna across a plurality of symbols, according to an example embodiment of the inventive concepts.

FIG. 15 is a diagram of an example of an operation of measuring the reflection coefficient of the antenna 40, according to an example embodiment of the inventive concepts. In some embodiments, operations in FIG. 15 may be performed by the antenna controller 14 in FIG. 1, and hereinafter, FIG. 15 is described with reference to FIG. 1.

In some embodiments, a reflection coefficient may be computed from each of a plurality of symbols, and based on the computed reflection coefficients, the reflection coefficient of the antenna 40 may be determined. For example, as illustrated in FIG. 15, three reflection coefficients $\Gamma_x$, $\Gamma_y$, and $\Gamma_z$ may be computed from each of three symbols (SYMx, SYMy, and SYMz), and from the three reflection coefficients $\Gamma_x$, $\Gamma_y$, and $\Gamma_z$, or, for example, as an average of the three reflection coefficients $\Gamma_x$, $\Gamma_y$, and $\Gamma_z$, the reflection coefficient F of the antenna 40 may be determined. The antenna controller 14 may control the coupling direction of the coupler 31 such that a plurality of reflection coefficients may be computed from each of the plurality of symbols. For example, as illustrated in FIG. 15, the antenna controller 14 may toggle the coupling direction of the coupler 31 at a period of the symbol length $T_{SYM}$. Although FIG. 15 illustrates an example in which the reflection coefficient F of the antenna 40 is determined based on the three consecutive symbols (SYMx, SYMy, and SYMz), in some embodiments, the reflection coefficient F of the antenna 40 may be determined based on more than two symbols or more than three symbols, and in some embodiments, may be determined based on two or more discontinuous (e.g., out of sequence) symbols.

Figure 16:
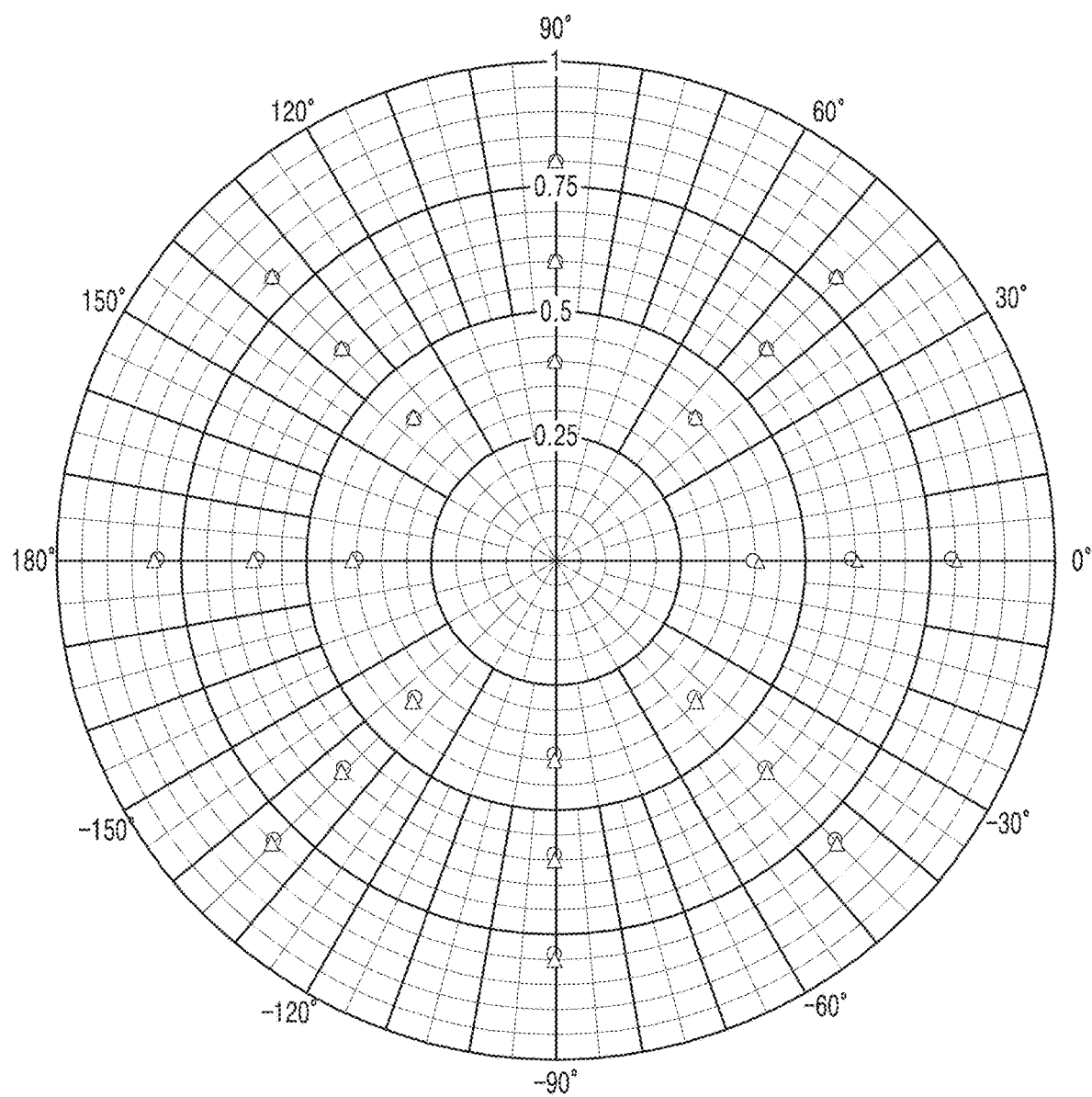
FIG. 16 is a diagram of measured reflection coefficients of an antenna, according to an example embodiment of the inventive concepts.

FIG. 16 is a diagram of measured reflection coefficients of an antenna, according to an example embodiment of the inventive concepts. FIG. 16 illustrates a simulation result by using the above-described method of measuring the reflection coefficient of the antenna.

As indicated by triangular markers in FIG. 16, each antenna may have a reflection coefficient that has a magnitude of one of about 0.4, about 0.6, and about 0.8, and a phase of one of about 0°, about 45°, about 90°, about 135°, about 180°, about 225°, about 270°, and about 315°. As illustrated by circular markers in FIG. 16, according to the method of measuring the reflection coefficient of the antenna according to an example embodiment of the inventive concepts, the reflection coefficients measured by using a transmit signal of new radio (NR) sub-6G 100 MHz may coincide with actual reflection coefficients.

Figure 17:
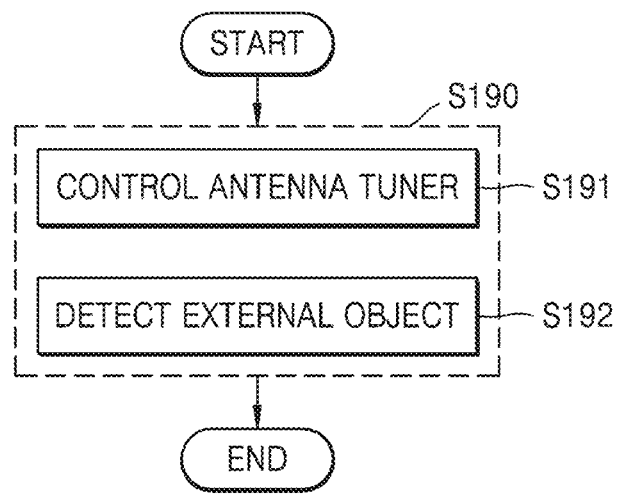
FIG. 17 is a flowchart of a method of using a reflection coefficient of an antenna, according to an example embodiment of the inventive concepts.

FIG. 17 is a flowchart of a method of using a reflection coefficient of an antenna, according to an example embodiment of the inventive concepts. In some embodiments, operation S190 of FIG. 17 may be performed subsequently, after operation S180 in FIG. 3 and operation S280 in FIG. 5 in which the reflection coefficient of the antenna is computed. In FIG. 17, operation S190 is illustrated as including operations S191 and S192, but in some embodiments, operation S190 may include only one of operations S191 and/or S192. In addition, in some embodiments, operation S190 may be performed by the antenna controller 14 in FIG. 1, and hereinafter, FIG. 17 is described with reference to FIG. 1.

An operation for controlling the antenna tuner 32 may be performed (S191). For example, the antenna controller 14 may control the antenna tuner 32 by using the front-end control signal C_FE such that the computed reflection coefficient of the antenna 40 is minimized or reduced. In other words, the antenna controller 14 may perform an antenna impedance tuning (AIT) based on the measured reflection coefficient of the antenna 40 by using the cyclic prefix portion CP of the symbol. According to some example embodiments, the antenna 40, tuned by the antenna controller 14 based on the measured reflection coefficient may be used to perform wireless communication (e.g., transmit and/or receive wireless communication signals) with another device (e.g., an external base station and/or UE). As the reflection coefficient measured according to some example embodiments is accurate, the antenna 40 is properly tuned by the antenna controller 14 (e.g., tuned to have a determined or designed impedance), and the wireless communication may be performed without signal degradation or with low signal degradation.

An operation of detecting an external object may be performed (S192). When the external object is near the wireless communication device 5, like a user of the wireless communication device 5, the reflection coefficient of the antenna 40 may change. In a wireless communication system using a signal in a high frequency band such as a millimeter wave, the wireless communication device 5 may output a signal having a high transmission power via the antenna 40. Accordingly, the user of the wireless communication device 5 may absorb high energy from an electromagnetic wave generated by the antenna 40, and it may detect whether the user is allowed to access the wireless communication device 5 to reduce energy absorbed by the user, or to detect a portion of the wireless communication device 5 that the user has accessed. To this end, the antenna controller 14 may compare the measured reflection coefficient of the antenna 40 with a designed (e.g., determined) reflection coefficient of the antenna 40, and based on an error between the measured reflection coefficient and the designed reflection coefficient, may determine whether an external object such as the user has accessed the wireless communication device 5 (or the antenna 40).

Figure 18:
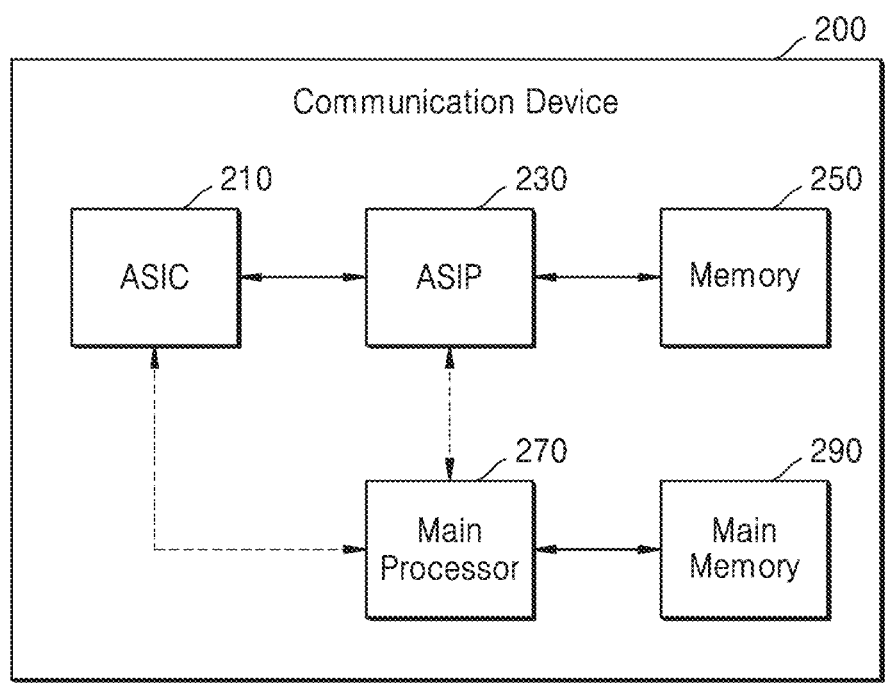
FIG. 18 is a block diagram of an example of a communication device, according to an example embodiment of the inventive concepts.

FIG. 18 is a block diagram of an example of a communication device 200, according to an example embodiment of the inventive concepts. In some embodiments, the communication device 200 may perform operations of at least some of the components included in the controller 10 in FIG. 1.

As illustrated in FIG. 18, the communication device 200 may include an application specific integrated circuit (ASIC) 210, an application specific instruction set processor (ASIP) 230, a memory 250, a main processor 270, and/or a main memory 290. Two or more of the ASIC 210, the ASIP 230, and/or the main processor 270 may communicate with each other. In addition, at least two or more of the ASIC 210, the ASIP 230, the memory 250, the main processor 270, and/or the main memory 290 may be embedded in one chip.

The ASIP 230 may include an integrated circuit customized for a particular usage, support a dedicated instruction set for a particular application, and/or execute instructions contained in the dedicated instruction set. The memory 250 may communicate with the ASIP 230 and/or may store, as a non-volatile storage, a plurality of instructions executed by the ASIP 230. For example, the memory 250 may include a type of memory accessible by the ASIP 230, as a non-limited example, such as random access memory (RAM), read-only memory (ROM), tape, a magnetic disk, an optical disk, a volatile memory, a non-volatile memory, and/or a combination thereof.

The main processor 270 may control the communication device 200 by executing a plurality of instructions. For example, the main processor 270 may control the ASIC 210 and/or the ASIP 230, process data received via the wireless communication network and/or process a user input to the communication device 200. The main memory 290 may communicate with the main processor 270 and/or may store, as a non-volatile storage, the plurality of instructions executed by the main processor 270. For example, the main memory 290 may include a memory accessible by the main processor 270, as a non-limited example, such as RAM, ROM, tape, a magnetic disk, an optical disk, a volatile memory, a non-volatile memory, and/or a combination thereof.

A method of measuring a reflection coefficient of an antenna may be performed by at least one of components included in the communication device 200 of FIG. 18. In some embodiments, operations of the antenna controller 14 in FIG. 1 may be implemented as a plurality of instructions stored in the memory 250, and the ASIP 230 may perform at least one of operations of the method of measuring the reflection coefficient of the antenna by executing a plurality of instructions stored in the memory 250. In some embodiments, at least one of the operations of the method of measuring the reflection coefficient of the antenna may be performed by a hardware block designed through logic synthesis, etc., and such a hardware block may be included in the ASIC 210. In some embodiments, at least one of the operations of the method of measuring the reflection coefficient of the antenna may be implemented as a plurality of instructions stored in the main memory 290, and the main processor 270 may perform the at least one of the operations by executing the plurality of instructions stored in the main memory 290.

Conventional devices calculate the reflection coefficient of an antenna based on a transmit signal and a delay until a signal reflected from the antenna corresponding to the transmit signal is fed back. The conventional devices utilize additional components to obtain the transmit signal and rely on an accurate determination of the delay of the reflected signal. Accordingly, the conventional devices use excessive overhead (e.g., the cost of, and/or physical space occupied by, the additional components) and consume excessive resources determining the delay of the reflected signal (e.g., processor and/or power resources). However, according to some example embodiments, an improved wireless communication device is provided that accurately measures the reflection coefficient of an antenna without the use of the additional components and without relying on a determination of the delay of the reflected signal. Therefore, the improved wireless communication device overcomes the disadvantages of the conventional devices to reduce overhead and resource consumption.

While the inventive concepts have been particularly shown and described with reference to embodiments thereof, it will be understood that various changes in form and details may be made therein without departing from the spirit and scope of the following claims.

What is claimed is:

1. A device for measuring a reflection coefficient of an antenna, the device comprising:
   processing circuitry configured to,
      extract a first feedback signal and a second feedback signal from a third feedback signal based on first symbol information of a first symbol included in a radio frequency (RF) transmit signal transferred to the antenna, the first feedback signal corresponding to at least a portion of a cyclic prefix portion of the first symbol, the second feedback signal corresponding to at least a portion of a back-end portion of the first symbol, the third feedback signal being generated from a portion of the RF transmit signal provided by a coupler, and
      compute the reflection coefficient based on the first feedback signal and the second feedback signal.

2. The device of claim 1, wherein the processing circuitry is configured to:
   set the coupler in a first coupling direction before the first feedback signal is generated based on the first symbol information; and
   set the coupler in a second coupling direction before the second feedback signal is generated based on the first symbol information.

3. The device of claim 1, further comprising:
   a transmission controller configured to control a transmitter configured to generate the RF transmit signal,
   wherein the processing circuitry is configured to,
      receive a windowing interval including a boundary of the first symbol from the transmission controller, and
      compute the reflection coefficient based on first feedback information of the first feedback signal and second feedback information of the second feedback signal, the first feedback information including the first feedback signal without portions of the first feedback signal corresponding to the windowing interval, and the second feedback information including the second feedback signal without portions of the second feedback signal corresponding to the windowing interval.

4. The device of claim 3, wherein
   the processing circuitry is configured to request the transmission controller to shorten the windowing interval.

5. The device of claim 1, wherein the first symbol information comprises:
   a length of the first symbol;
   a length of the cyclic prefix portion; and
   timing information indicating a boundary of the first symbol.

6. The device of claim 5, further comprising:
   a timing analyzer configured to generate the timing information by determining a correlation between the first feedback signal and the second feedback signal.

7. The device of claim 5, further comprising:
   a transmission controller configured to control a transmitter configured to generate the RF transmit signal, wherein
   the processing circuitry is configured to,
      receive a timing signal indicating a symbol boundary from the transmission controller, and
      generate the timing information based on a path delay of the RF transmit signal and the timing signal.

8. The device of claim 5, further comprising:
   a reception controller configured to control a receiver configured to receive a receive signal via the antenna, wherein
   the processing circuitry is configured to,
      control the reception controller to generate the timing information based on the third feedback signal, and
      receive the timing information from the reception controller.

9. A method of measuring a reflection coefficient of an antenna, the method comprising:
   obtaining first symbol information of a first symbol included in a radio frequency (RF) transmit signal provided to the antenna via a coupler;
   obtaining a first feedback signal based on the first symbol information, the first feedback signal being generated from an RF feedback signal provided in a first interval in which the coupler transfers at least a portion of a cyclic prefix portion of the first symbol;
   obtaining a second feedback signal based on the first symbol information, the second feedback signal generated from the RF feedback signal provided in a second interval in which the coupler transfers at least a portion of a back-end portion of the first symbol; and
   computing the reflection coefficient based on the first feedback signal and the second feedback signal.

10. The method of claim 9, further comprising:
    setting the coupler in a first coupling direction before the first interval based on the first symbol information; and setting the coupler in a second coupling direction before the second interval based on the first symbol information.

11. The method of claim 10, wherein
the first coupling direction and the second coupling direction are different coupling directions among a forward coupling of the coupler and a reverse coupling of the coupler.

12. The method of claim 9, wherein
the obtaining the first symbol information includes obtaining a windowing interval from a transmission controller, the windowing interval including a boundary of the first symbol; and
the computing the reflection coefficient includes,
extracting portions of the first interval excluding the windowing interval from the first feedback signal to generate first feedback information,
extracting portions of the second interval excluding the windowing interval from the second feedback signal to generate second feedback information, and
computing the reflection coefficient based on the first feedback information and the second feedback information.

13. The method of claim 12, wherein the obtaining the first symbol information further comprises:
requesting the transmission controller to shorten the windowing interval.

14. The method of claim 9, wherein the first symbol information comprises:
a length of the first symbol;
a length of the cyclic prefix portion; and
timing information indicating a boundary of the first symbol.

15. The method of claim 14, wherein the obtaining the first symbol information comprises:
determining a plurality of correlations between the first feedback signal and the second feedback signal; and
generating the timing information based on a highest correlation among the plurality of correlations.

16. The method of claim 14, wherein the obtaining the first symbol information comprises:
receiving a timing signal indicating a symbol boundary; and
generating the timing information based on a path delay of the RF transmit signal and the timing signal.

17. The method of claim 14, wherein the obtaining the first symbol information comprises:
providing the first feedback signal and the second feedback signal to a reception controller configured to control a receiver configured to receive a receive signal via the antenna; and
receiving the timing information from the reception controller.

18. The method of claim 9, further comprising:
controlling an antenna tuner connected to the antenna based on the reflection coefficient.

19. The method of claim 9, further comprising:
detecting an external object near the antenna based the reflection coefficient and a determined reflection coefficient of the antenna.

20. A method of measuring a reflection coefficient of an antenna, the method comprising:
obtaining first symbol information of a first symbol included in a radio frequency (RF) transmit signal provided to the antenna via a coupler;
setting the coupler in a first coupling direction before a first interval based on the first symbol information, the coupler transferring at least a portion of a cyclic prefix portion of the first symbol during the first interval;
setting the coupler in a second coupling direction before a second interval based on the first symbol information, the coupler transferring at least a portion of a back-end portion of the first symbol during the second interval; and
computing the reflection coefficient based on an RF feedback signal provided by the coupler during the first interval and the second interval.

* * * * *